United States Patent
Yun et al.

(10) Patent No.: US 11,430,804 B2
(45) Date of Patent: Aug. 30, 2022

(54) VERTICAL MEMORY DEVICES

(71) Applicant: SAMSUNG ELECTRONICS CO., LTD., Suwon-si (KR)

(72) Inventors: Kyunghwa Yun, Hwaseong-si (KR); Chanho Kim, Seoul (KR); Dongku Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 16/809,059

(22) Filed: Mar. 4, 2020

(65) Prior Publication Data

US 2021/0036008 A1    Feb. 4, 2021

(30) Foreign Application Priority Data

Jul. 31, 2019  (KR) .......................... 10-2019-0092970

(51) Int. Cl.
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC ...................... H01L 27/11582; H01L 27/11578
See application file for complete search history.

(56) References Cited

U.S. PATENT DOCUMENTS

| | | | |
|---|---|---|---|
| 8,897,089 B2 | 11/2014 | Kim et al. | |
| 9,306,041 B2 | 4/2016 | Hwang et al. | |
| 9,548,121 B2 | 1/2017 | Lee et al. | |
| 9,576,973 B2 | 2/2017 | Lee et al. | |
| 9,691,782 B1 | 6/2017 | Hwang et al. | |
| 9,716,181 B2 | 7/2017 | Nam et al. | |
| 10,199,326 B1 | 2/2019 | Ohsaki | |
| 2015/0162342 A1 | 6/2015 | Lee et al. | |
| 2016/0013202 A1* | 1/2016 | Hwang | H01L 27/11565 257/314 |
| 2016/0329340 A1 | 11/2016 | Hwang et al. | |
| 2017/0062454 A1* | 3/2017 | Lu | H01L 21/76877 |
| 2019/0326320 A1* | 10/2019 | Choi | H01L 29/1079 |
| 2020/0105784 A1* | 4/2020 | Jang | H01L 29/4234 |

* cited by examiner

Primary Examiner — Christopher A Johnson
(74) Attorney, Agent, or Firm — Sughrue Mion, PLLC

(57) ABSTRACT

A vertical memory device is provided. The vertical memory device includes gate electrodes formed on a substrate and spaced apart from each other in a first direction substantially perpendicular to an upper surface of the substrate, the gate electrodes including a first gate electrode and a second gate electrode that is interposed between the first gate electrode and the substrate; a channel extending through the gate electrodes in the first direction; an insulating isolation pattern extending through the first gate electrode in the first direction, and spaced apart from the first gate electrode in a second direction substantially parallel to the upper surface of the substrate; and a blocking pattern disposed on an upper surface, a lower surface and a sidewall of each of the gate electrodes, the sidewall of the gate electrodes facing the channel. The insulating isolation pattern directly contacts the first gate electrode.

20 Claims, 26 Drawing Sheets

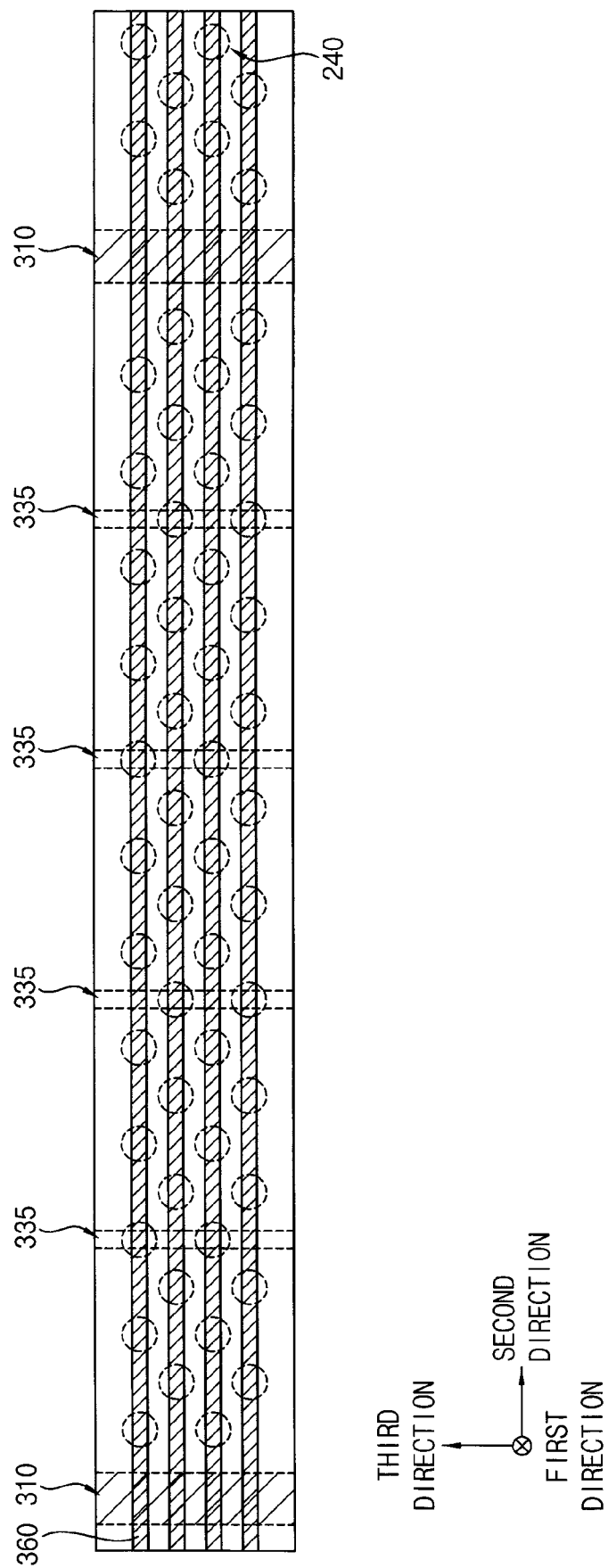

VERTICAL MEMORY DEVICES

CROSS-REFERENCE TO THE RELATED APPLICATION

This application claims priority from Korean Patent Application No. 10-2019-0092970, filed on Jul. 31, 2019 in the Korean Intellectual Property Office, the contents of which are herein incorporated by reference in their entirety.

BACKGROUND

1. Field

Methods and apparatuses consistent with embodiments relate to vertical memory devices.

2. Related Art

In a method of manufacturing a VNAND flash memory device, a mold including insulation layers and sacrificial layers may be formed on a substrate, an opening may be formed to extend through the mold, the sacrificial layers may be removed through the opening to form a gap, and a gate electrode may be formed to fill the gap. However, as the number of sacrificial layers included in the mold and stacked in a vertical direction increases, an aspect ratio of the mold may increase, and thus the mold may be tilted after the opening is formed.

SUMMARY

Example embodiments provide vertical memory devices having improved degree of integration.

According to example embodiments, there is provided a vertical memory device. The vertical memory device includes gate electrodes formed on a substrate and spaced apart from each other in a first direction substantially perpendicular to an upper surface of the substrate, the gate electrodes including a first gate electrode and a second gate electrode that is interposed between the first gate electrode and the substrate; a channel extending through the gate electrodes in the first direction; an insulating isolation pattern extending through the first gate electrode in the first direction, and spaced apart from the first gate electrode in a second direction substantially parallel to the upper surface of the substrate; and a blocking pattern disposed on an upper surface, a lower surface and a sidewall of each of the gate electrodes, the sidewall of the gate electrodes facing the channel. The insulating isolation pattern directly contacts the first gate electrode.

According to example embodiments, there is provided a vertical memory device. The vertical memory device includes a channel extending on a substrate in a vertical direction substantially perpendicular to an upper surface of the substrate, the channel includes a plurality of portions, each of the plurality of portions of the channel having a width that gradually increases as distance from the substrate increases, the plurality of portions being sequentially stacked and connected with each other; gate electrodes spaced apart from each other on the substrate in the vertical direction, each of the gate electrodes surrounding the channel, in a horizontal direction substantially parallel to the upper surface of the substrate, and including a gate conductive pattern and a gate barrier pattern that covers an upper surface, a lower surface and a sidewall of the gate conductive pattern, the sidewall of the gate conductive pattern facing the channel; and an insulating isolation pattern extending through a first gate electrode and at least one gate electrode that is interposed between the substrate and the first gate electrode, and the insulating isolation pattern separating the first gate electrode in the horizontal direction. The first gate electrode surrounds a first portion of the plurality of portions of the channel, remaining portions of the plurality of portions of the channel being interposed between the substrate and the first portion. The first portion of the channel has a length in the vertical direction shorter than that of each of the remaining portions of the plurality of portions of the channel.

According to example embodiments, there is provided a vertical memory device. The vertical memory device includes gate electrodes disposed on a substrate and separated from each other in a first direction substantially perpendicular to an upper surface of the substrate; a plurality of common source lines (CSLs) spaced apart from each other along a second direction substantially parallel to the upper surface of the substrate, each of the plurality of CSLs extending through each of the gate electrodes in the first direction and extending in a third direction substantially parallel to the upper surface of the substrate and intersecting the second direction; channels spaced apart from each other along each of the second direction and the third direction between two adjacent CSLs from among the plurality of CSLs, each of the channels extending through the gate electrodes in the first direction; a charge storage structure disposed on an outer sidewall of each of the channels, the charge storage structure including a tunnel insulation pattern, a charge storage pattern and a first blocking pattern sequentially stacked; pads formed on each of the channels; an insulating isolation pattern extending in the first direction through and directly in contact with a first gate electrode, from among the gate electrodes, that acts as a string selection line (SSL) and is formed on an uppermost level among the gate electrodes, and extending in the third direction to separate the first gate electrode in the second direction; a second blocking pattern covering an upper surface, a lower surface, and a sidewall of each of the gate electrodes, the sidewall of the gate electrodes facing one of the channels; and a plurality of bit lines spaced apart from each other and electrically connected with the pads, each of the plurality of bit lines extending in the third direction.

In a method of manufacturing a vertical memory device according to example embodiments, a first opening may be formed through all layers of a mold in a vertical direction substantially perpendicular to an upper surface of the substrate, a metal may be injected through the first opening to form a gate electrode, and a second opening may be formed to extend through at least an uppermost layer of the mold in the vertical direction. Accordingly, the gate electrode may be formed before the second opening is formed, so that the gate electrode may be properly formed even when a plurality of second openings are formed between two first openings neighboring each other.

BRIEF DESCRIPTION OF THE DRAWINGS

FIGS. 20 to 22 are plan views illustrating vertical memory devices in accordance with example embodiments.

DETAILED DESCRIPTION

Vertical memory devices and methods of manufacturing the same in accordance with example embodiments will be described more fully hereinafter with reference to the accompanying drawings.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
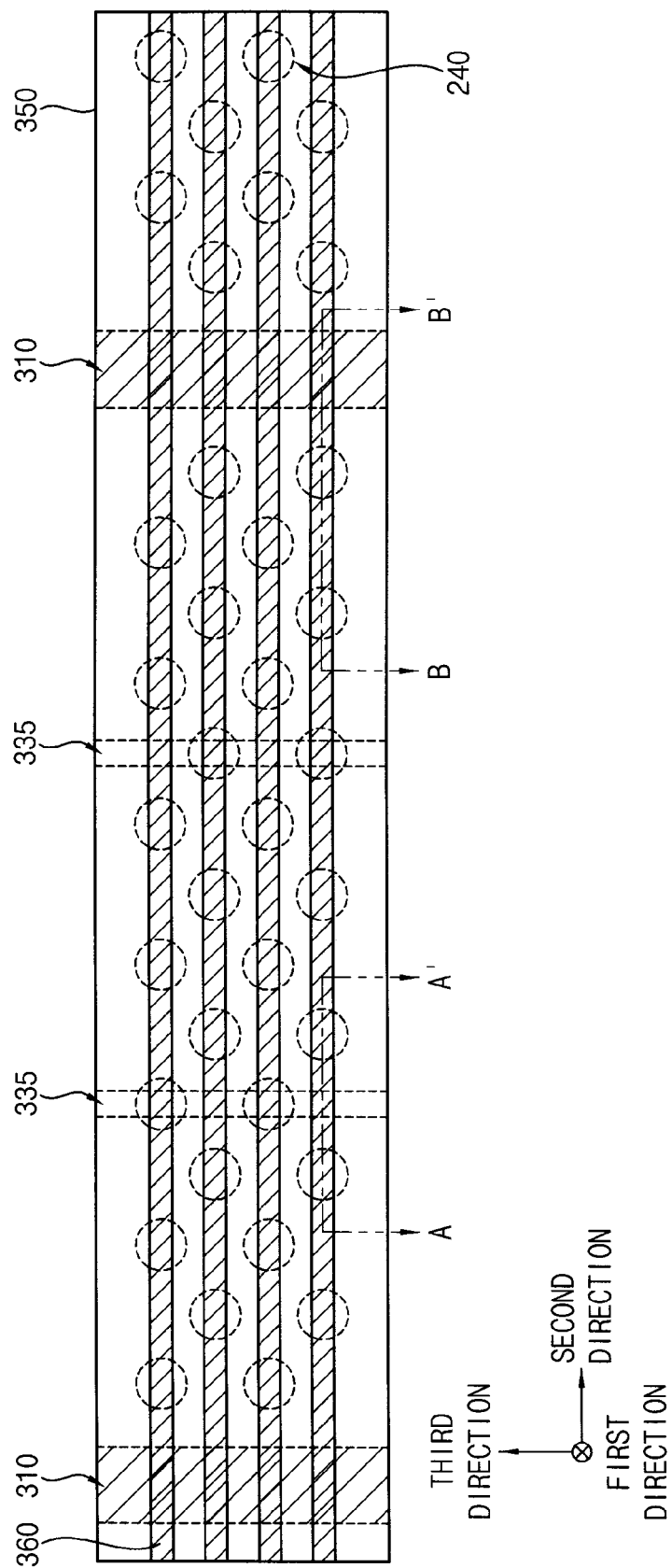
FIGS. 1, 2A, 2B and 3 are plan and cross-sectional views illustrating a vertical memory device in accordance with example embodiments.
Figure 2A:
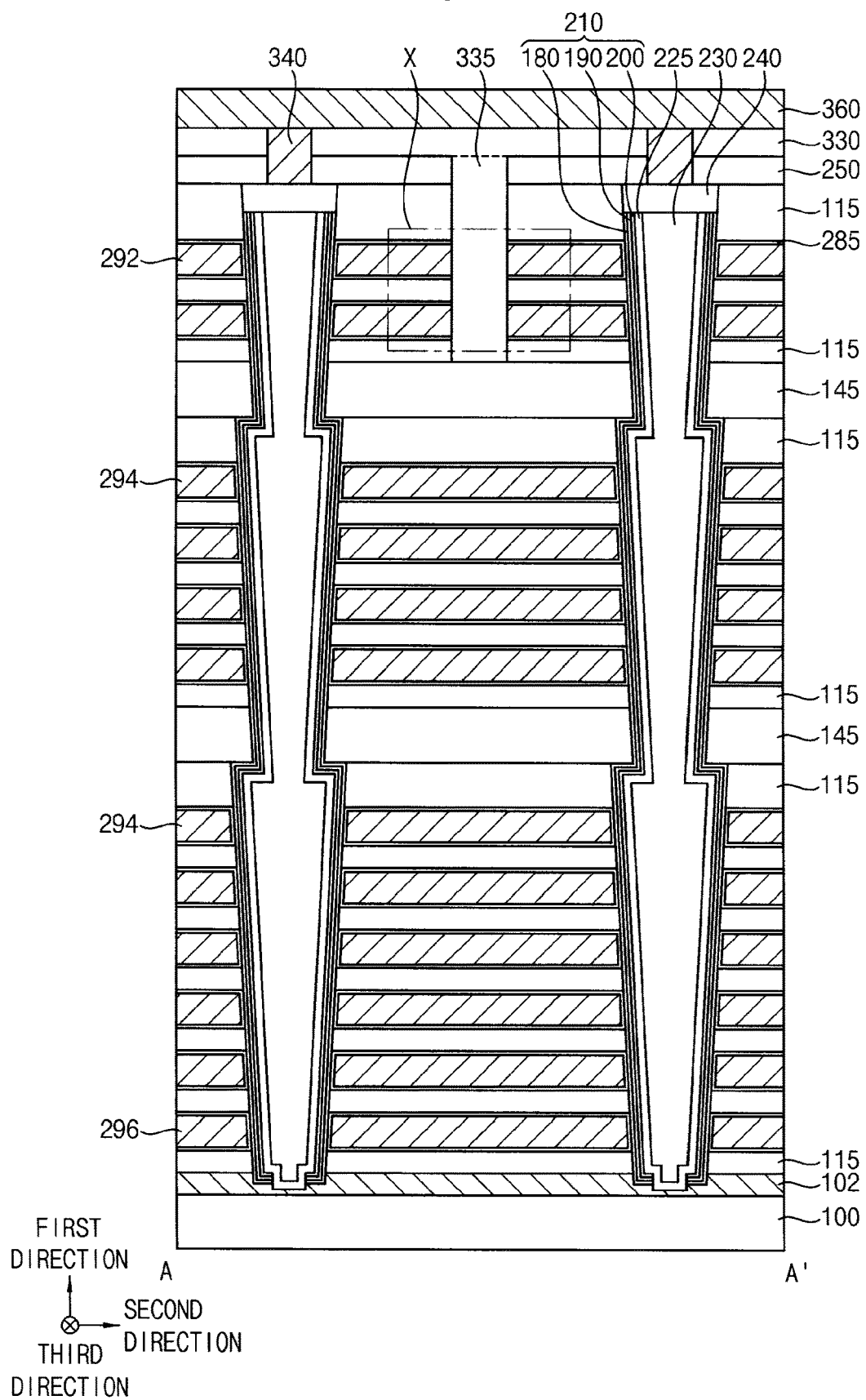
Figure 2B:
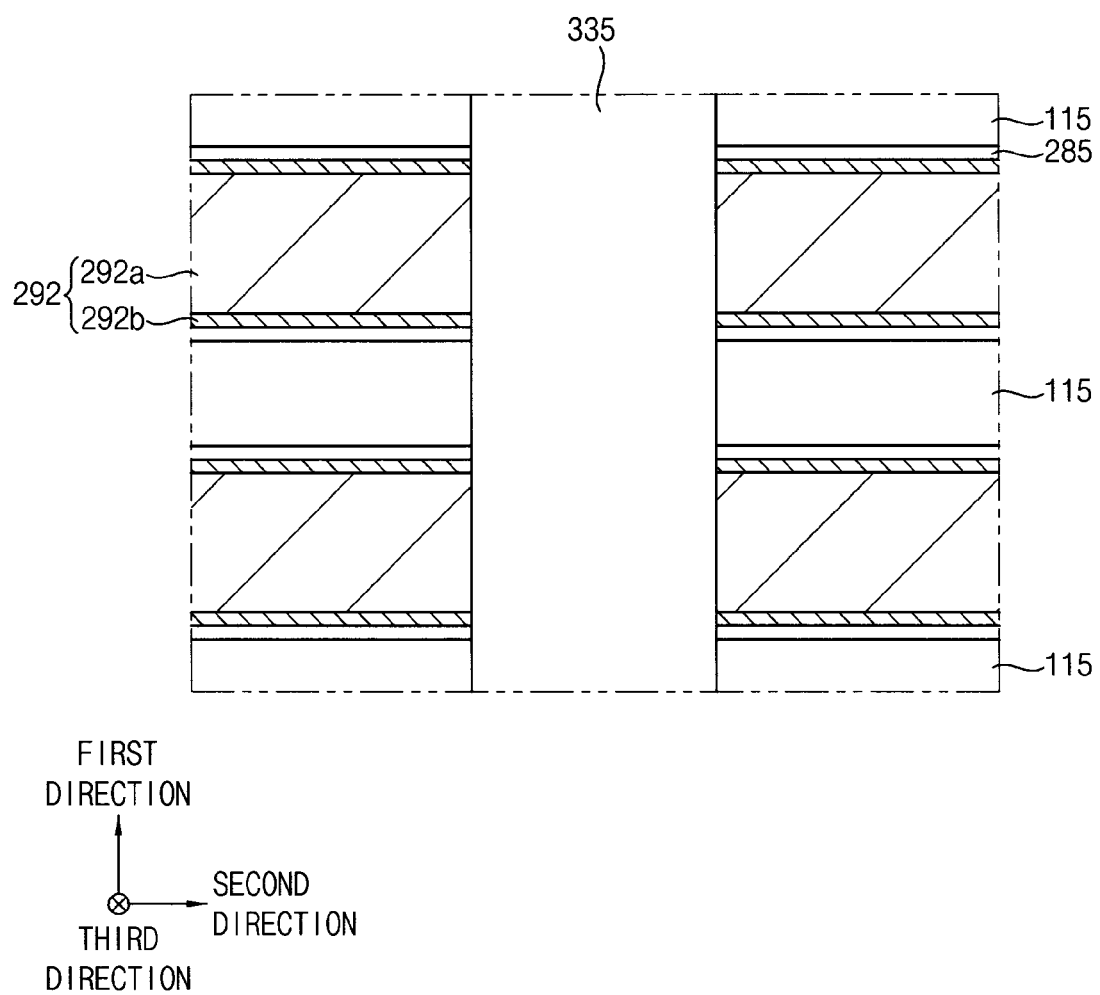
Figure 3:
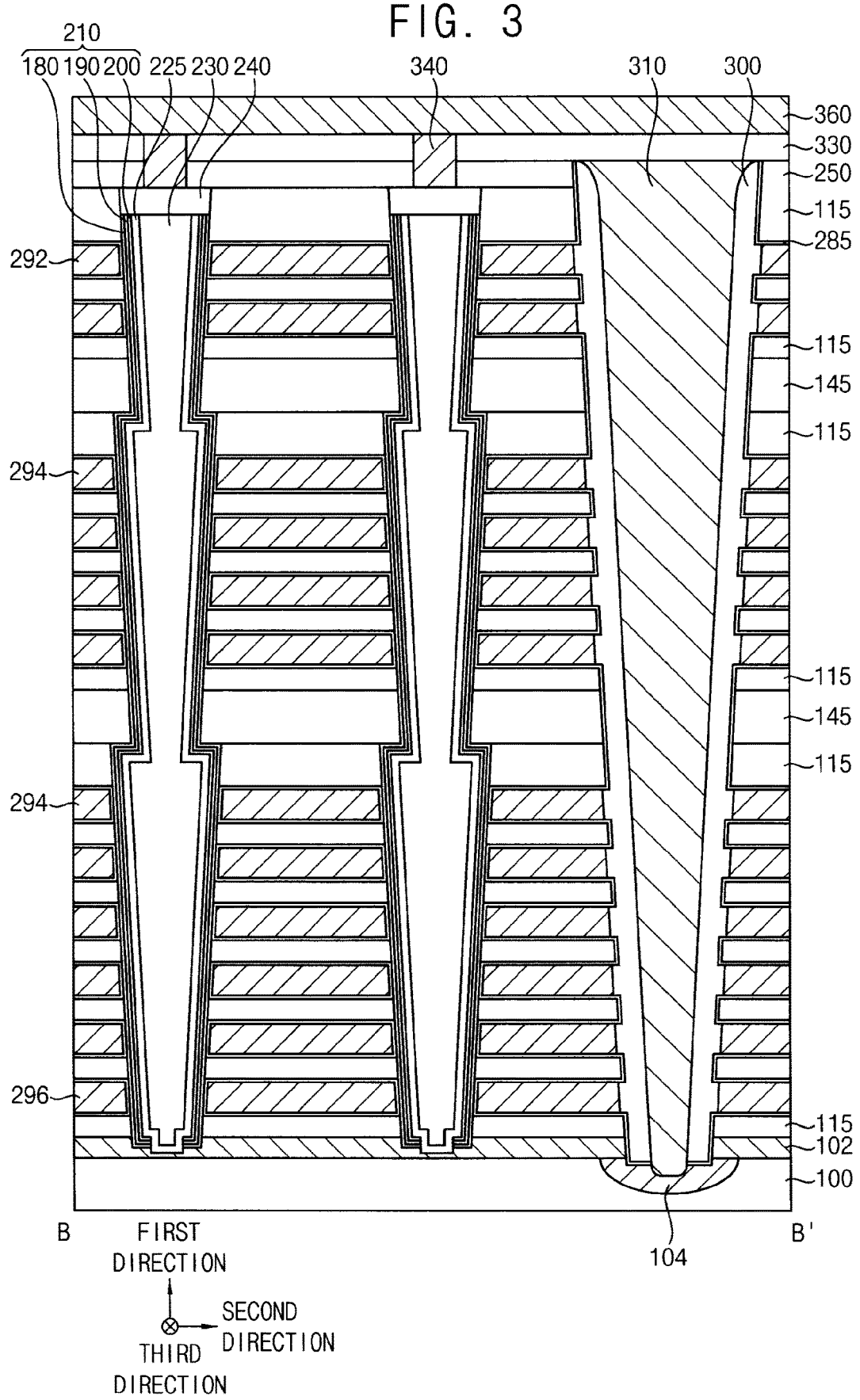

FIGS. 1, 2A, 2B and 3 are plan and cross-sectional views illustrating a vertical memory device in accordance with example embodiments. FIG. 1 is the plan view, FIG. 2A is a cross-sectional view taken along a line A-A' of FIG. 1, and FIG. 3 is a cross-sectional view taken along a line B-B' of FIG. 1. FIG. 2B is an enlarged cross-sectional view of a region X of FIG. 2A.

Hereinafter, in the following detailed description (excluding claims), a vertical direction substantially perpendicular to an upper surface of a substrate is defined as a first direction, and two directions intersecting with each other among horizontal directions substantially parallel to the upper surface of the substrate are defined as second and third directions, respectively. In example embodiments, the second and third directions may be orthogonal to each other.

Referring to FIGS. 1 to 3, the vertical memory device may include a gate electrode structure, an insulation pattern structure, a connecting pattern 145, a first structure formed on a substrate 100 to extend through the gate electrode structure, the insulation pattern structure and the connecting pattern 145, and an insulating isolation pattern 335. The vertical memory device may further include first and second impurity regions 102 and 104, a pad 240, a second blocking pattern 285, a second spacer 300, a CSL 310, a contact plug 340, a bit line 360, and first to third insulating interlayers 250, 330 and 350.

The substrate 100 may include silicon, germanium, silicon-germanium or a III-V compound such as GaP, GaAs, GaSb, etc. In some embodiments, the substrate 100 may be a silicon-on-insulator (SOI) substrate or a germanium-on-insulator (GOI) substrate.

The first impurity region 102 may be formed at an upper portion of the substrate 100. The first impurity region 102 may include carbon, or n-type or p-type impurities.

The gate electrode structure may include a plurality of gate electrodes at a plurality of levels, respectively, spaced apart from each other in the first direction. Additionally, the gate electrode structure may extend in the second direction, and a plurality of gate electrode structures may be formed in the third direction. That is, the gate electrode structures, each of which may extend in the second direction at the same level, may be divided in the third direction by the second spacer 300 and the common source line (CSL) 310 in a first opening 260 (see FIGS. 12 and 13) extending in the third direction. Also, an uppermost one of the gate electrodes of each of the gate electrode structures may be spaced apart from each other by the insulating isolation pattern 335 in a second opening 320 (see FIGS. 16 and 17) extending in the third direction.

In example embodiments, the CSL 310 extending in the third direction may be formed in the first opening 260, and a plurality of CSLs 310 may be formed along the second direction. The second spacer 300 may be formed on each of opposite sidewalls of the CSL 310 in the second direction. The second impurity region 104 may be formed at an upper portion of the substrate 100 adjacent a lower surface of the CSL 310.

The insulating isolation pattern 335 extending in the third direction may be formed in the second opening 320, and may contact a lower surface of the second insulating interlayer 330. The insulating isolation pattern 335 may be integrally formed with the second insulating interlayer 330 (see FIG. 18A), and thus may be seen to protrude from the second insulating interlayer 330 in the first direction. In example embodiments, a plurality of insulating isolation patterns 335 may be formed to be spaced apart from each other in the second direction between two CSLs 310 neighboring each other in the second direction. FIGS. 1 and 3 describe two insulating isolation patterns 335 formed between two neighboring CSLs 310, however, embodiments are not limited thereto.

The CSL 310 may include a metal, a metal nitride and/or a metal silicide, the second spacer 300 may include an oxide, e.g., silicon oxide, and the second impurity region 104 may include n-type impurities, e.g., phosphorous, arsenic, etc.

Each of the gate electrode structures may include at least one third gate electrode 296, a plurality of second gate electrodes 294, and at least one first gate electrode 292 sequentially stacked in the first direction.

In example embodiments, the third gate electrode 296 may serve as a ground selection line (GSL), each of the second gate electrodes 294 may serve as a word line, and the first gate electrode 292 may serve as a string selection line (SSL).

FIG. 2A shows that the third gate electrode 296 is formed at one level, the second gate electrodes 294 are formed at nine levels, respectively, and the first gate electrode 292 is formed at two levels, respectively, however, embodiments are not limited thereto. That is, each of the first and third gate electrodes 292 and 296 may be formed at one or a plurality of levels, and the second gate electrode 294 may be formed at a plurality of levels. Particularly, the second gate electrode 294 may be formed at more than nine levels, and some of the second gate electrodes 294 adjacent the first gate electrode 292 and/or the third gate electrode 296 may serve as a dummy word line.

Each of the first to third gate electrodes 292, 294 and 296 may include a gate conductive pattern extending in the second direction and a gate barrier pattern covering upper and lower surfaces and a portion of a sidewall of the gate conductive pattern. The gate conductive pattern may include a low resistance metal, e.g., tungsten, titanium, tantalum, platinum, etc., and the gate barrier pattern may include a metal nitride, e.g., titanium nitride, tantalum nitride, etc.

In example embodiments, the insulating isolation pattern 335 may extend through the first gate electrode 292 formed at an uppermost level or at least one level thereunder among the gate electrodes, and thus may directly contact a sidewall of each of first gate conductive pattern 292*a* and first gate barrier pattern 292*b* of the first gate electrode 292. Accordingly, each of the first gate conductive pattern 292*a* and the first gate barrier pattern 292*b* of the first gate electrode 292 may surround the insulating isolation pattern 335.

The insulation pattern structure may include a plurality of insulation patterns 115 stacked in the first direction at a plurality of levels, respectively. Each of the insulation patterns 115 may be formed between an upper surface of the first impurity region 102 at the upper portion of the substrate 100 and the third gate electrode 296, between neighboring ones of the first to third gate electrodes 292, 294 and 296 in the first direction, and on the first gate electrode 292.

In example embodiments, each of the insulation patterns 115 at the respective plurality of levels may extend in the third direction, a plurality of insulation patterns 115 may be spaced apart from each other by the first opening 260 in the second direction, and the insulation patterns 115 formed between the first gate electrodes 292 and formed on and under the first gate electrodes 292 may be spaced apart from each other by the second opening 320 in the second direction. The insulation patterns 115 may include an oxide, e.g., silicon oxide.

In example embodiments, the connecting pattern 145 may be formed between two insulation patterns 115 in the middle levels, respectively. The connecting pattern 145 may include a material having a low gap-filling characteristic or a low step coverage characteristic, e.g., tetra ethyl ortho silicate (TEOS), high density plasma (HDP) oxide, etc.

The first structure may extend in the first direction on the first impurity region 102 through the gate electrode structure, the connecting pattern 145 and the insulation pattern structure, and the pad 240 may be formed on the first structure. The first structure may include a channel 225 extending in the first direction from the upper surface of the first impurity region 102, a charge storage structure 210 covering an outer sidewall of the channel 225, and a filling pattern 230 filling an inner space defined by the channel 225.

As the first structure extends through the gate electrode structure, each of the first to third gate electrodes 292, 294 and 296 of the gate structure may surround the channel 225 and the charge storage structure 210 of the first structure.

In example embodiments, the channel 225 may have a hollow cylindrical shape or a cup-like shape, the filling pattern 230 may fill the inner space formed by the channel 225. That is, a lower surface and a sidewall of the filling pattern 230 may be covered by the channel 225.

The channel 225 may include, e.g., crystalline silicon, and the filling pattern 230 may include an oxide, e.g., silicon oxide.

In example embodiments, a plurality of channels 225 may be formed to be spaced apart from each other along each of the second and third directions between the two CSLs 310 neighboring each other in the second direction. The channels 225 arranged in the third direction altogether may form a channel column, a plurality of channel columns may be formed to be spaced apart from each other along the second direction, and the plurality of channel columns altogether may form a channel block. In one embodiment, the channel block including more than 14 channel columns may be formed between the two CSLs 310 neighboring each other in the second direction.

In example embodiments, the charge storage structure 210 covering the outer sidewall of the channel 225 may have a cup-like shape of which a central bottom is opened. The charge storage structure 210 may include a tunnel insulation pattern 200, a charge storage pattern 190 and a first blocking pattern 180 sequentially stacked in a horizontal direction from the outer sidewall of the channel 225.

The tunnel insulation pattern 200 and the first blocking pattern 180 may include an oxide, e.g., silicon oxide, and the charge storage pattern 190 may include a nitride, e.g., silicon nitride. The pad 240 may include, e.g., crystalline silicon doped with impurities.

In example embodiments, the channel 225 may include a third portion, a second portion and a first portion sequentially stacked in the first direction to contact each other, and each of the first to third portions of the channel 225 may have a sidewall oblique to an upper surface of the substrate 100. The first portion of the channel 225 may be formed at an upper portion of the channel 225 to have a length in the first direction shorter than second and third portions. In one embodiment, each of the first to third portions of the channel 225 may have a width gradually increasing from bottom to top.

The contact plug 340 may be formed on an upper surface of the pad 240, and the bit line 360 may be formed on an upper surface of the contact plug 340. The contact plug 340 may extend through the first and second insulating interlayers 250 and 330 to contact the upper surface of the pad 240, and the bit line 360 may extend through the third insulating interlayer 350 to contact the upper surface of the contact plug 340.

The contact plug 340 and the bit line 360 may include a metal, e.g., copper, aluminum, tungsten, titanium, tantalum, etc., and/or a metal nitride, e.g., titanium nitride, tantalum nitride, tungsten nitride, etc., and the first to third insulating interlayers 250, 330 and 350 may include an oxide, e.g., silicon oxide.

The second blocking pattern 285 may be formed on upper and lower surfaces and a portion of a sidewall of each of the gate electrodes, and a sidewall of each of the insulation patterns 115. However, the second blocking pattern 285 may not be formed on a sidewall opposite to the insulating isolation pattern 335 of the first gate electrode 292 among the gate electrodes. Accordingly, the insulating isolation pattern 335 may directly contact the sidewalls of the first gate conductive pattern 292*a* and the first gate barrier pattern 292*b* of the first gate electrode 292, and a sidewall of the second blocking pattern 285. The second blocking pattern 285 may also contact a sidewall of the charge storage structure 210.

In the vertical memory device, the channel block including the plurality of channels 225 that extends through the gate electrode structure formed between the two CSLs 310 neighboring each other in the second direction may be formed, and the channel block may include more than 14 channel columns including the plurality of channels 225 disposed in the third direction and being arranged in the second direction. In a method of manufacturing the vertical memory device described later, as the plurality of channels 225 are formed to support the mold structure to prevent tilting and extend through the gate electrode structure, the vertical memory device may have a stable structure without tilting.

As the plurality of channel columns are formed between the two CSLs 310 neighboring each other in the second direction, the plurality of insulating isolation pattern 335 that separate the first gate electrode 292 serving as a SSL may also be formed between the two CSLs 310 neighboring each other in the second direction. However, as will be described later, the insulating isolation pattern 335 is formed before the first gate electrode 292 is formed. This avoids a situation in which the gap 270 is partially blocked by the insulating isolation pattern 335 if the insulating isolation patter 335 is formed after the first gate electrode 292 is formed.

The insulating isolation pattern 335 may extend through an upper portion of the channel 225 included in some of the channel columns, and the channel 225 of which the upper portion is penetrated by the insulating isolation pattern 335 may serve as only a dummy channel. Accordingly, for example, when the channel block includes 14 channel columns arranged in the second direction and two insulating isolation patterns 335 are formed, 12 of the channel columns may include channels and two of the channel columns may include dummy channels. However, in example embodiments described later, the insulating isolation pattern 335 may also be formed between the channels 225 without extending through the upper portion of the channel 225.

Figure 12:
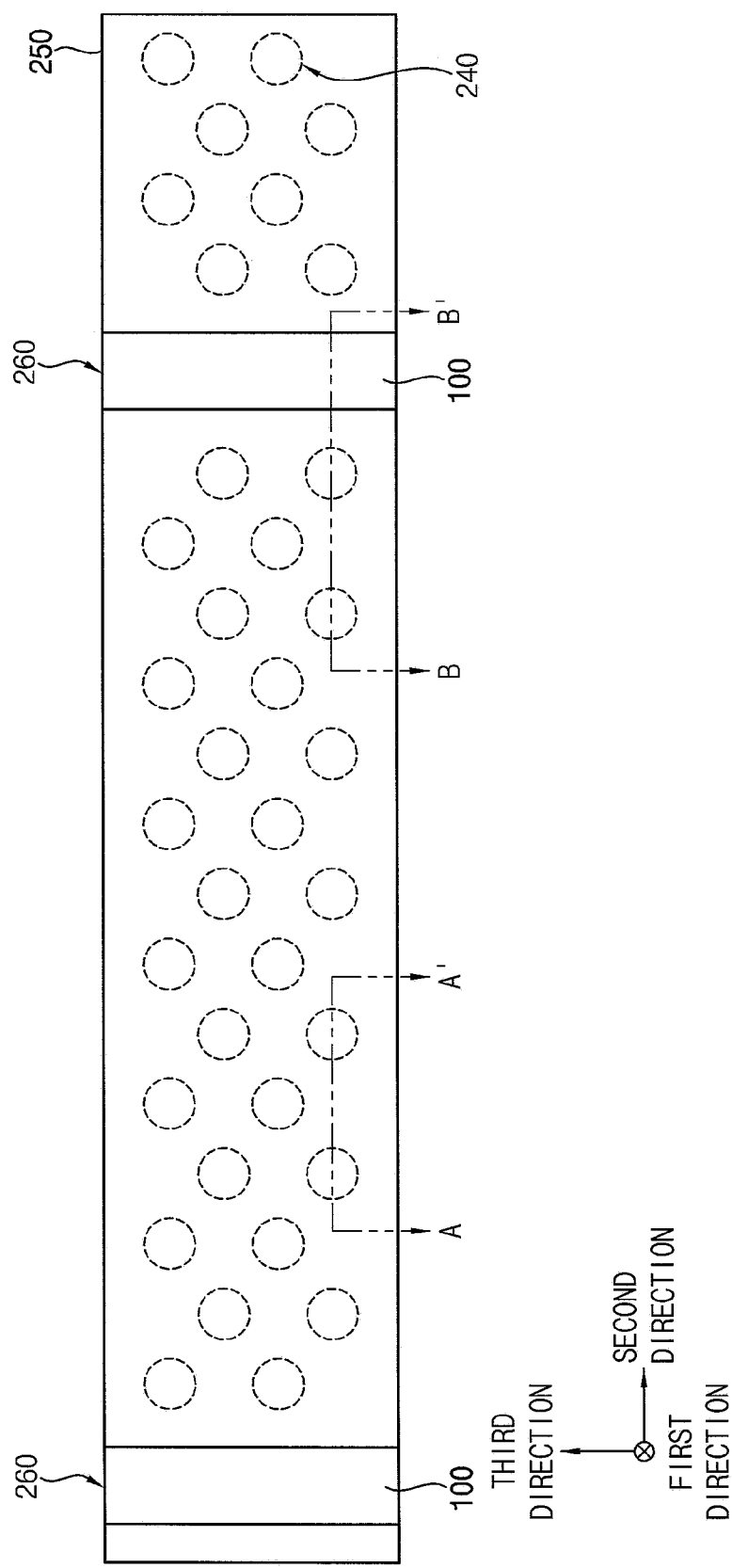
Figure 13:
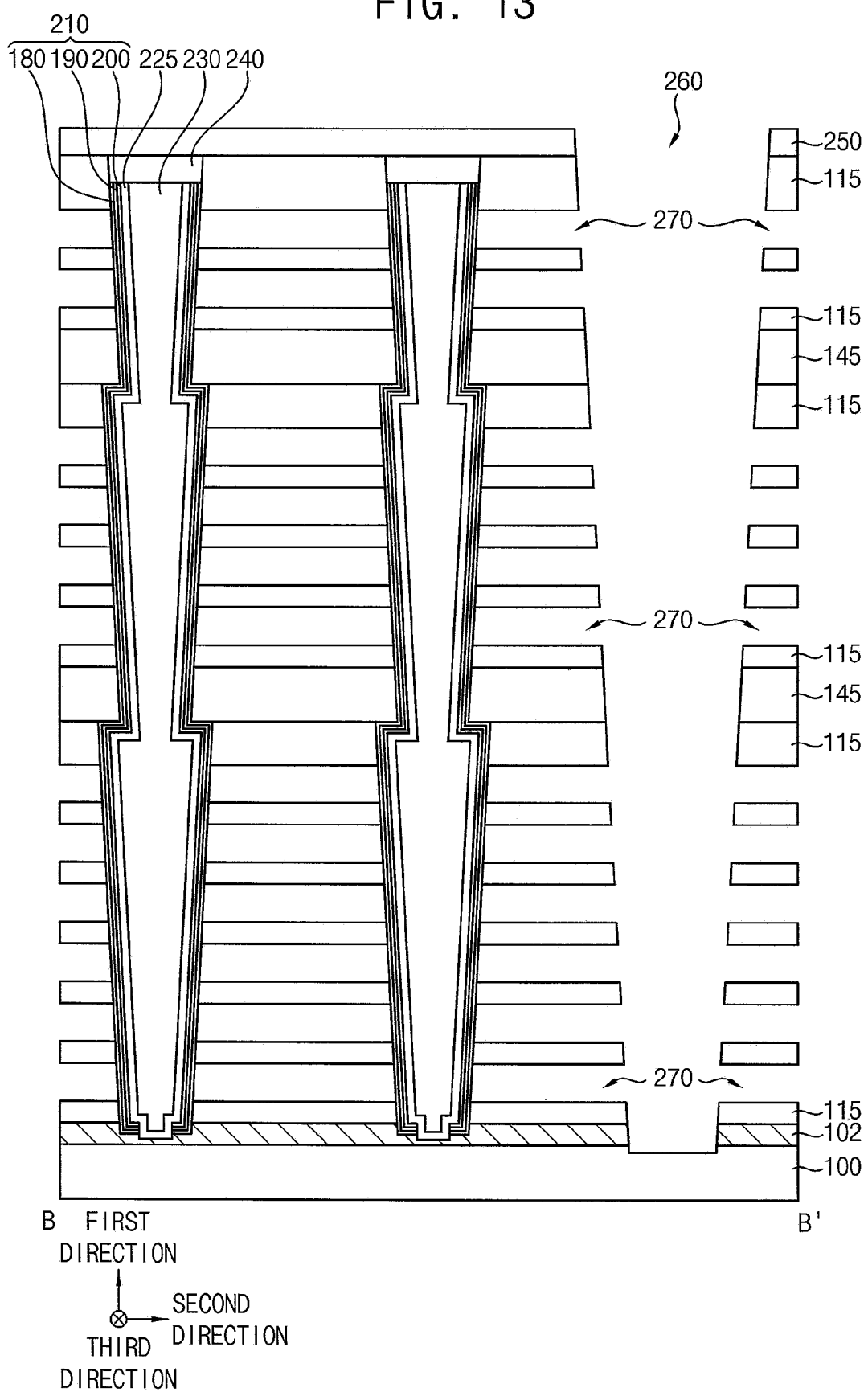
Figure 14:
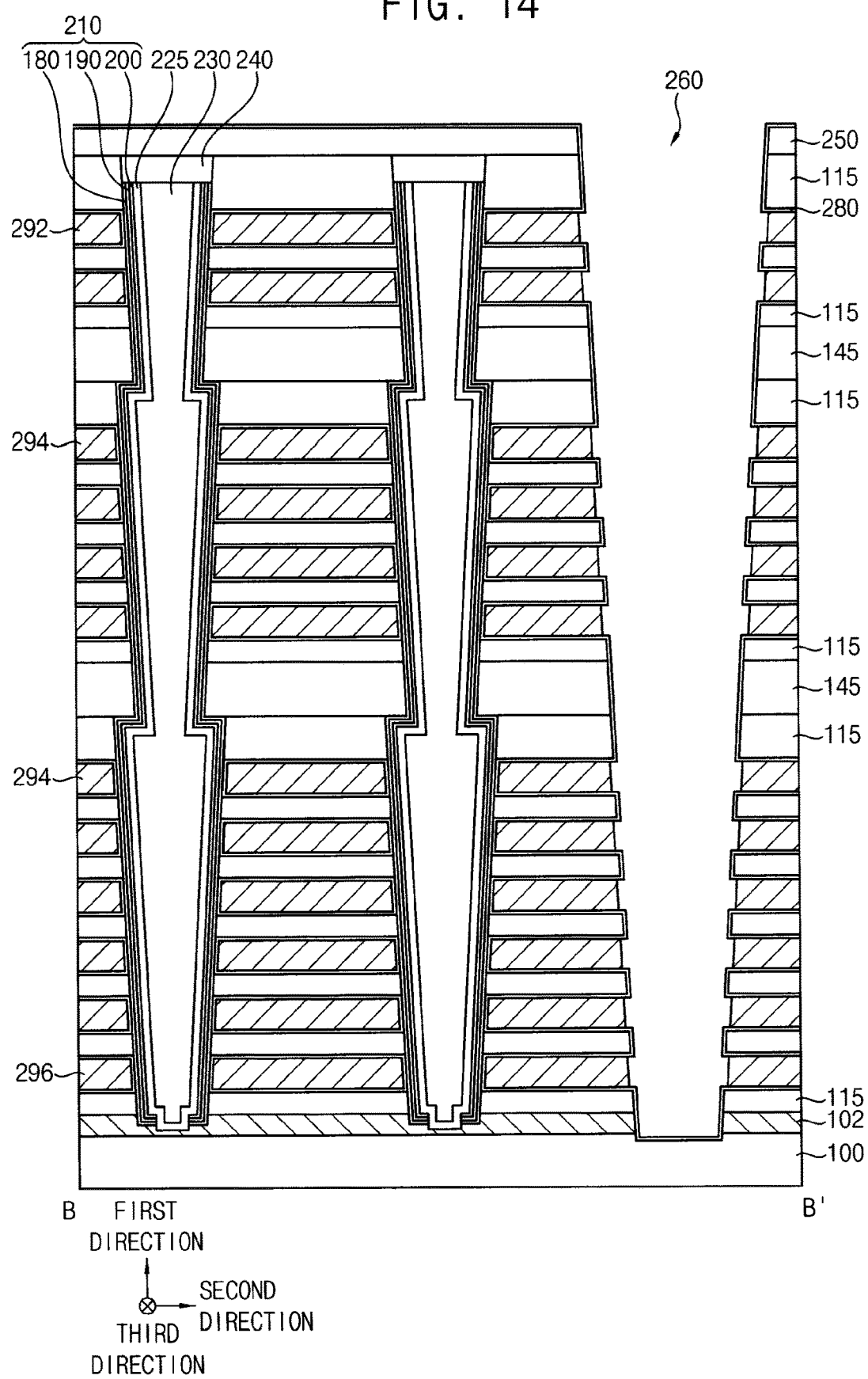
Figure 15:
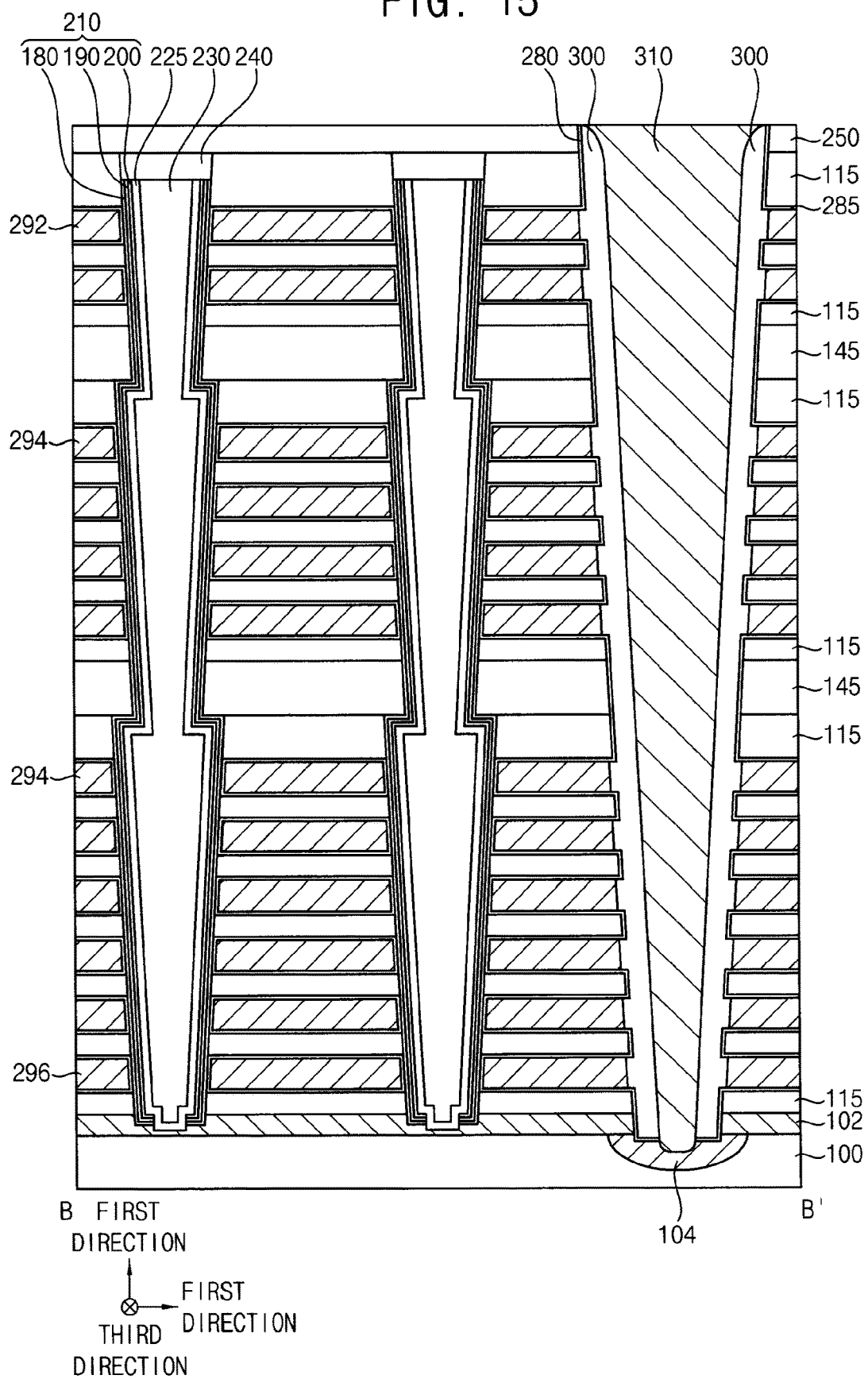
Figure 16:
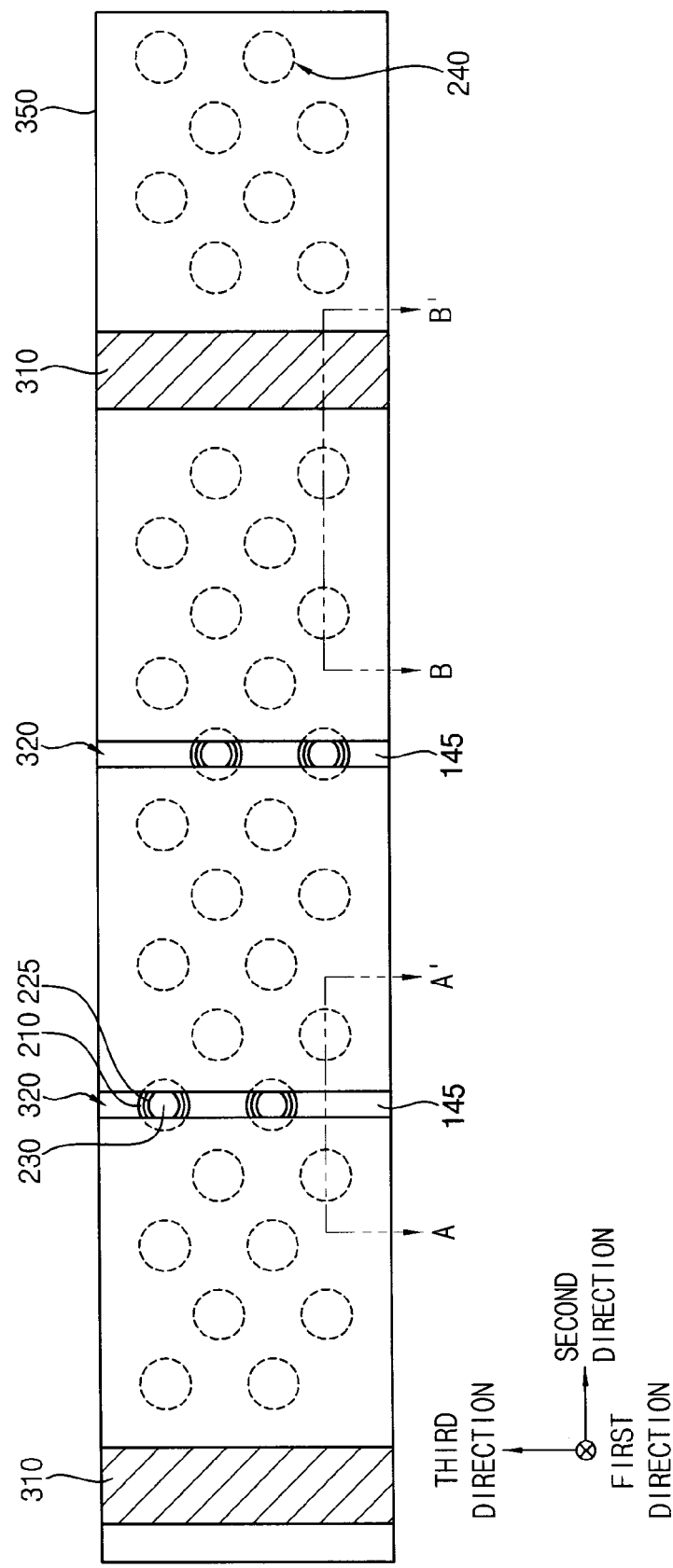

FIGS. 4 to 16, 17A and 17B are plan views and cross-sectional views illustrating stages of a method of manufacturing a vertical memory device in accordance with example embodiments. Specifically, FIGS. 5, 12 and 16 are plan views, FIGS. 4, 6-11 and 17A are cross-sectional views taken along lines A-A' of corresponding plan views, and FIGS. 13-15 are cross-sectional views taken along lines B-B' of corresponding plan views. FIG. 17B is an enlarged cross-sectional view of a region X of FIG. 17A.

Figure 4:
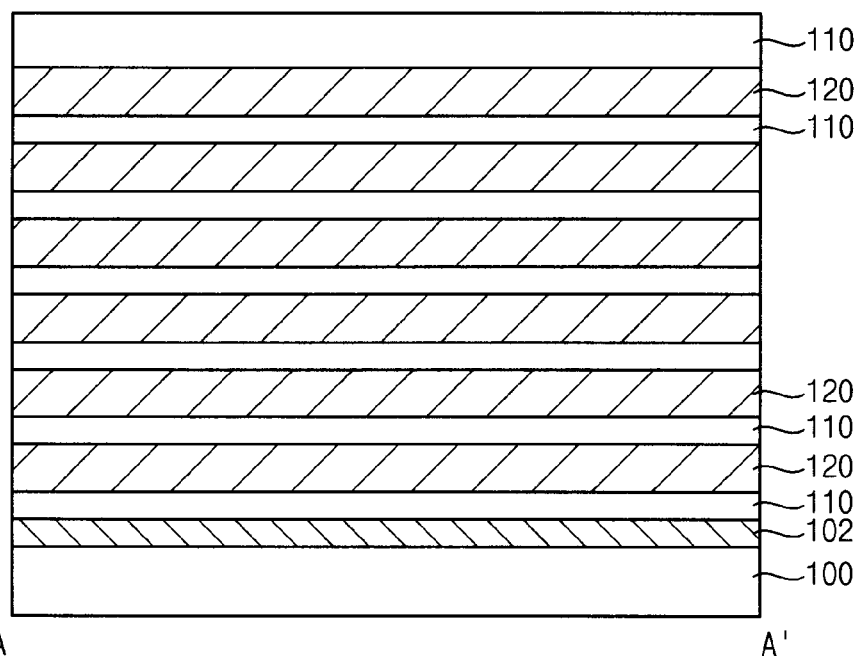
FIGS. 4 to 16, 17A and 17B are plan and cross-sectional views illustrating stages of a method of manufacturing a vertical memory device in accordance with example embodiments.
Figure 4:
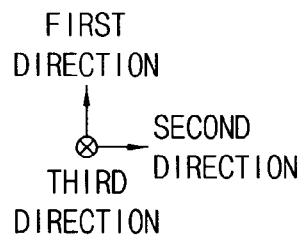
Figure 5:
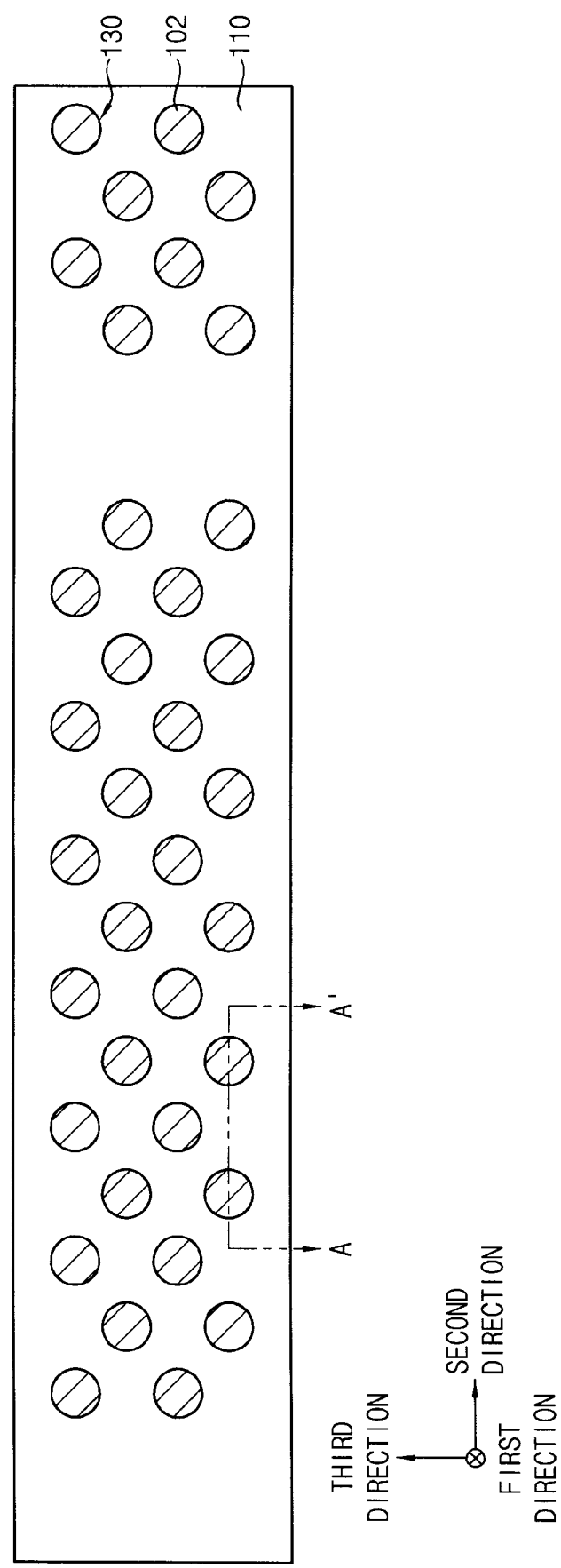

Referring to FIG. 4, after forming a first impurity region 102 on an upper portion of a substrate 100, an insulation layer 110 and a first sacrificial layer 120 may be alternately and repeatedly stacked in the first direction on the first impurity region 102 to form a first mold.

The first impurity region 102 may be formed by doping carbon, or n-type or p-type impurities on the upper portion of the substrate 100.

FIG. 4 shows that the first mold includes the insulation layers 110 and the first sacrificial layers 120 stacked on seven levels and six levels, respectively, however, embodiments are not limited thereto. That is, the first mold may include more or fewer insulation layers 110 and first sacrificial layers 120.

The insulation layer 110 and the first sacrificial layer 120 may be formed by, e.g., chemical vapor deposition (CVD) process, plasma enhanced chemical vapor deposition (PECVD) process, atomic layer deposition (ALD) process, etc. The insulation layer 110 may include an oxide, e.g., silicon oxide, and the first sacrificial layer 120 may include a nitride, e.g., silicon nitride.

Figure 6:
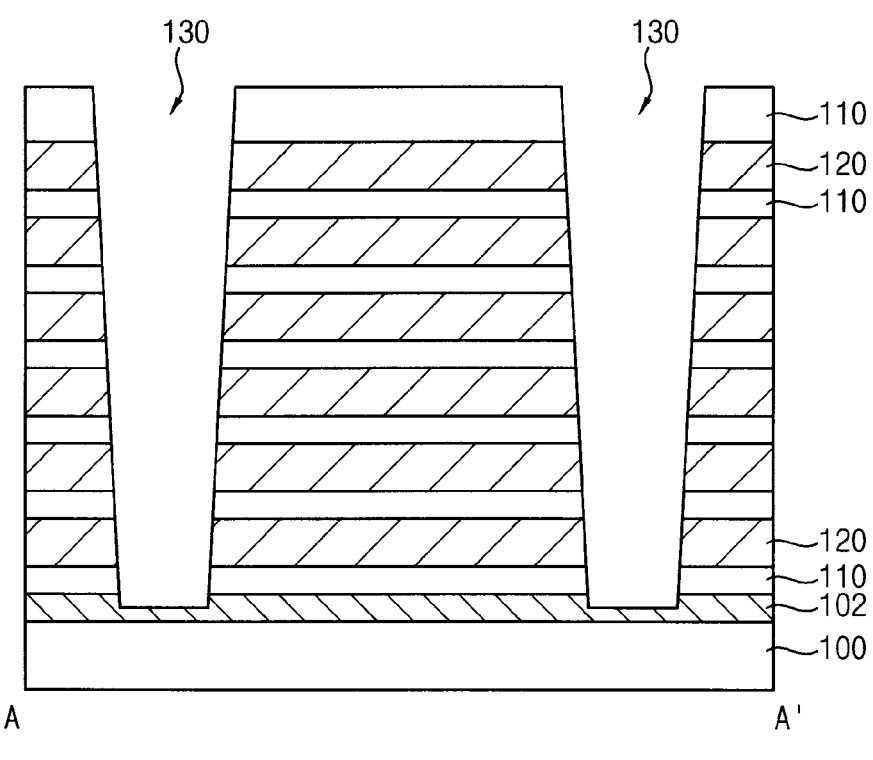
Figure 6:
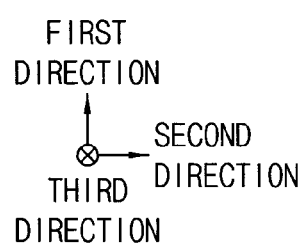

Referring to FIGS. 5 and 6, a first channel hole 130 may be formed to extend through the first mold and expose the first impurity region 102 on the upper portion of the substrate 100.

Particularly, a first photoresist pattern may be formed on an uppermost one of the insulation layers 110 of the first mold, and the insulation layers 110 and the first sacrificial layers 120 of the first mold may be etched using the first photoresist pattern as an etching mask to form the first channel hole 130 exposing an upper surface of the first impurity region 102. In example embodiments, a plurality of first channel holes 130 may be formed in each of the second and third directions.

In example embodiments, the first impurity region 102 may serve as an etch stop layer in the etching process for forming the first channel holes 130. That is, by doping impurities on the upper portion of the substrate 100 that includes, e.g., silicon, the etching selectivity of the insulation layer 110 and the first sacrificial layer 120 that includes, e.g., silicon oxide and silicon nitride, respectively, may be increased. Accordingly, the first channel holes 130 may be formed to have a uniform depth in the etching process.

However, in some cases, the process of forming the first impurity region 102 may also be omitted.

In example embodiments, a width of each of the first channel holes 130 may gradually decrease as the depth of each of the first channel holes 130 increases. That is, a sidewall of each of the first channel holes 130 may be oblique to an upper surface of the substrate 100. Accordingly, an upper portion of each of the first channel holes 130 may have a greater width than a lower portion of each of the first channel holes 130.

Figure 7:
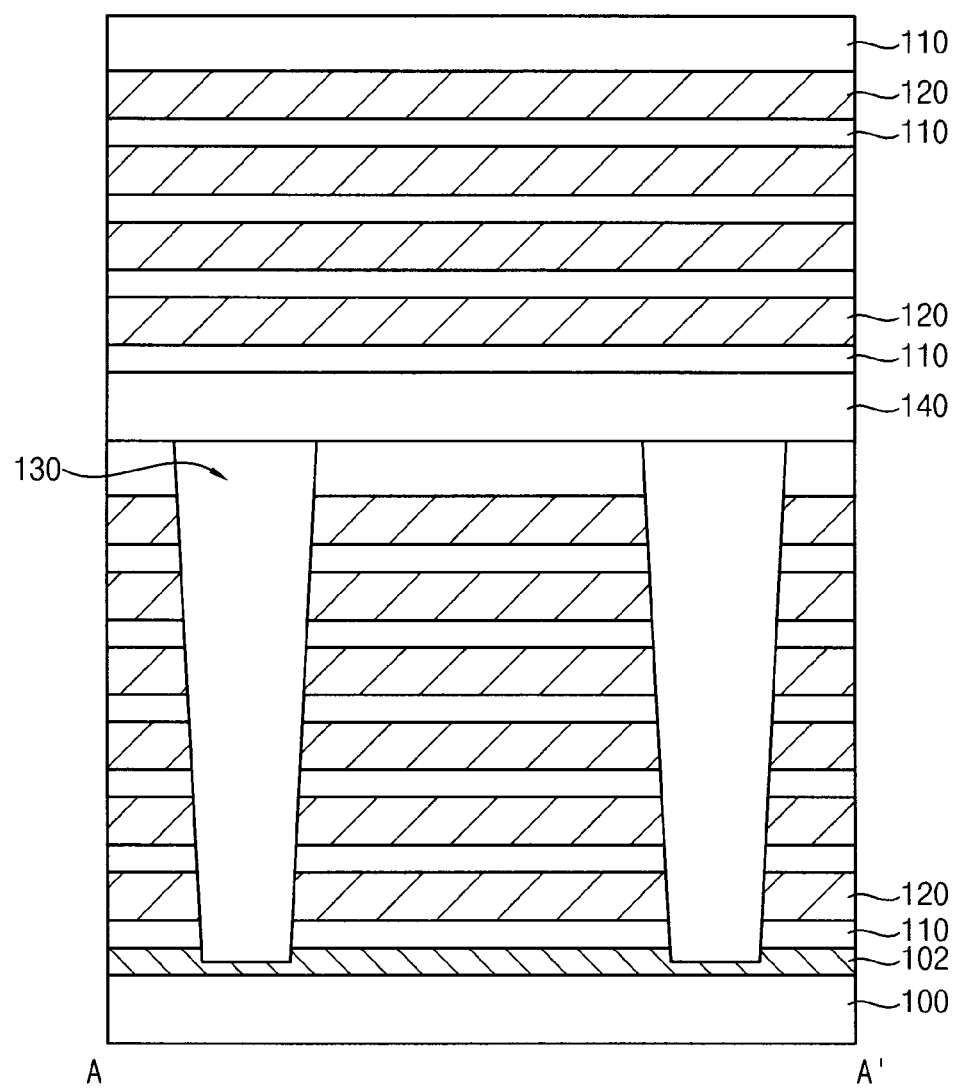

Referring to FIG. 7, after forming a connecting layer 140 on the uppermost one of the insulation layers 110 of the first mold, an upper portion of the connecting layer 140 may be planarized, and the insulation layer 110 and the first sacrificial layer 120 may be alternately and repeatedly formed again on the connecting layer 140 to form a second mold.

FIG. 7 shows that the second mold includes the insulation layers 110 and the first sacrificial layers 120 stacked on five levels and four levels, respectively, however, embodiments are not limited thereto. That is, the second mold may include more or fewer insulation layers 110 and first sacrificial layers 120.

In example embodiments, the connecting layer 140 may include a material having a low gap-filling characteristic or a low step coverage characteristic, e.g., tetra ethyl ortho silicate (TEOS), high density plasma (HDP) oxide, etc. Accordingly, the first channel holes 130 may not be filled by the connecting layer 140.

FIG. 7 shows that the connecting layer 140 has a flat lower surface, however, embodiments are not limited thereto. That is, a portion of the connecting layer 140 that faces an upper portion of each of the first channel holes 130 may be further formed, and thus the connecting layer 140 may also have a lower surface that is not flat.

Figure 8:
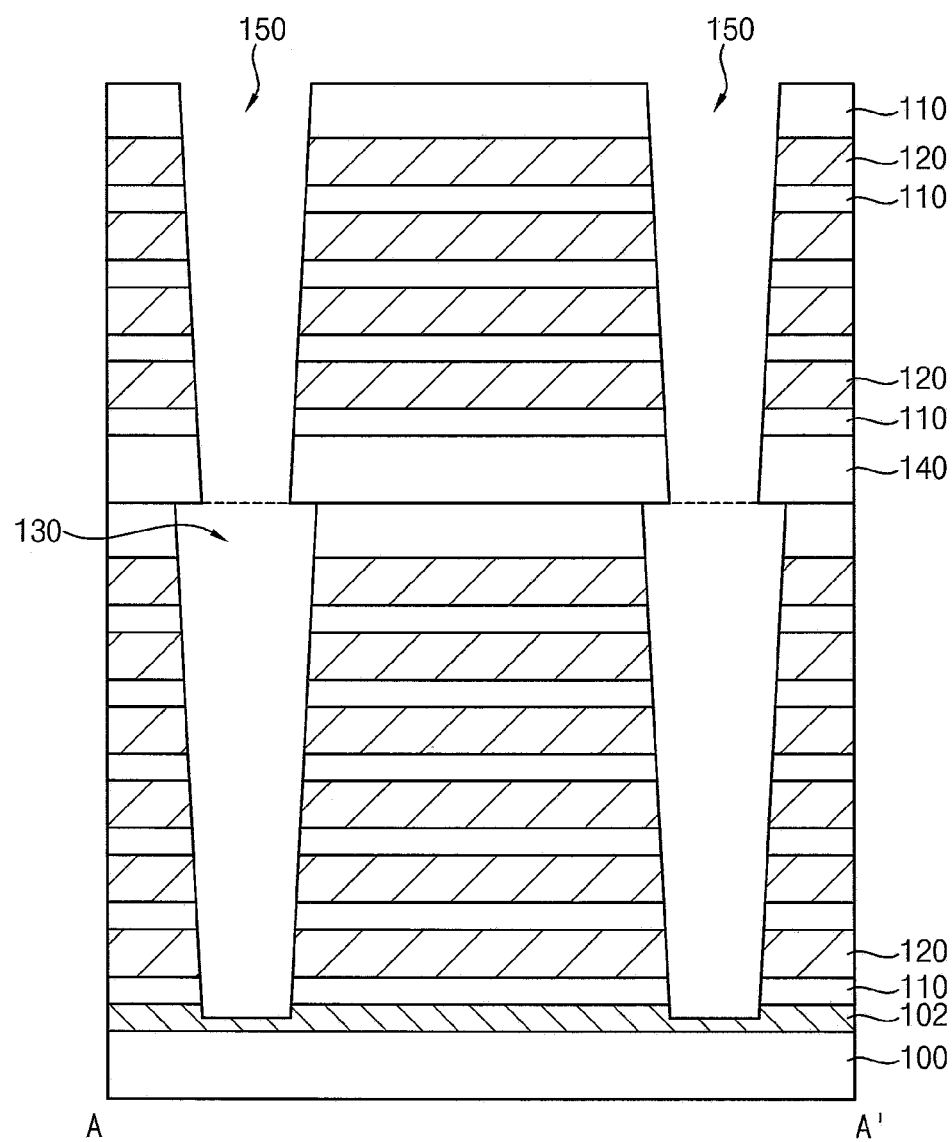

Referring to FIG. 8, a second channel hole 150 may be formed extending through the second mold and the connecting layer 140 to expose the first channel hole 130.

Particularly, a second photoresist pattern may be formed on an uppermost one of the insulation layers 110 of the second mold, and the insulation layers 110 and the first sacrificial layers 120 of the second mold and the connecting layer 140 may be etched using the second photoresist pattern as an etching mask to form the second channel hole 150 exposing the first channel hole 130. As the plurality of first channel holes 130 is formed in each of the second and third directions, a plurality of second channel holes 150 may be also formed in each of the second and third directions.

Like the first channel holes 130, a width of each of the second channel holes 150 may also gradually decrease as the depth of each of the second channel holes 150 increases, and a sidewall of each of the second channel holes 150 may also be oblique to the upper surface of the substrate 100. Accordingly, a top of each of the second channel holes 150 may have a greater width than a bottom of each of the second channel holes 150.

Figure 9:
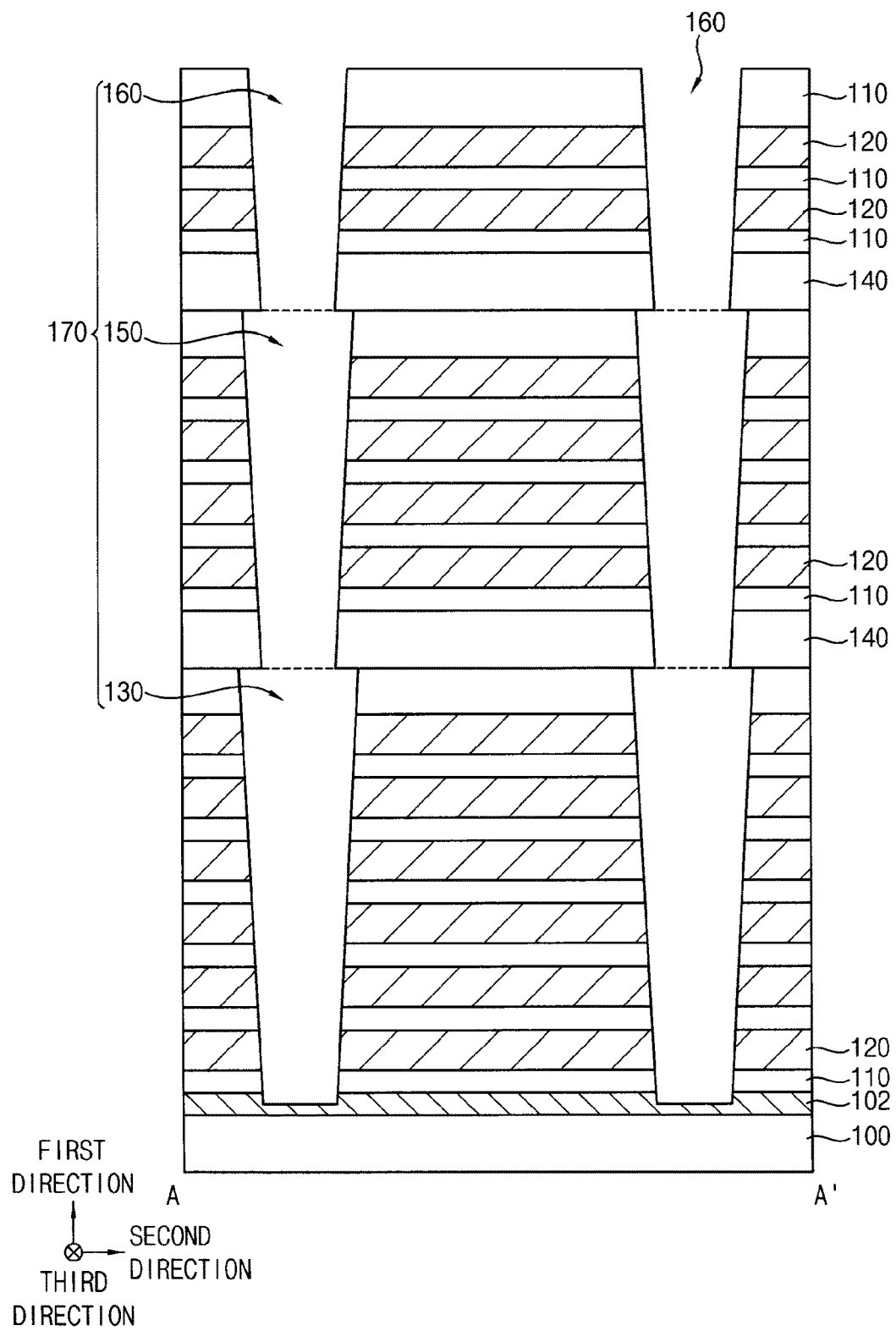

Referring to FIG. 9, processes similar to the processes described in FIGS. 7 and 8 may be performed.

Particularly, after forming a connecting layer 140 on the uppermost one of the insulation layers 110 of the second mold, an upper portion of the connecting layer 140 may be planarized, and the insulation layer 110 and the first sacrificial layer 120 may be alternately and repeatedly formed again on the connecting layer 140 to form a third mold. Then, a third photoresist pattern may be formed on an uppermost one of the insulation layers 110 of the third mold, and the insulation layers 110 and the first sacrificial layers 120 of the third mold and the connecting layer 140 may be etched using the third photoresist pattern as an etching mask to form a third channel hole 160 exposing the second channel hole 150. As the plurality of second channel holes 150 is formed in each of the second and third directions, a plurality of third channel holes 160 may be also formed in each of the second and third directions.

FIG. 9 shows that the third mold includes the insulation layers 110 and the first sacrificial layers 120 stacked on three levels and two levels, respectively, however, embodiments are not limited thereto. That is, the third mold may include more or fewer insulation layers 110 and first sacrificial layers 120.

Like the first and second channel holes 130 and 150, a width of each of the third channel holes 160 may also gradually decrease as the depth of each of the third channel holes 160 increases, and a sidewall of each of the third channel holes 160 may also be oblique to the upper surface of the substrate 100. Accordingly, a top of each of the third channel holes 160 may have a greater width than a bottom of each of the third channel holes 160.

Each set of first to third channel holes 130, 150 and 160 may form a channel hole structure 170. Also, the first to third molds sequentially stacked on the substrate 100 altogether may be referred to as a mold structure. In example embodiments, the channel hole structure 170 may extend through the mold structure in the first direction.

Figure 10:
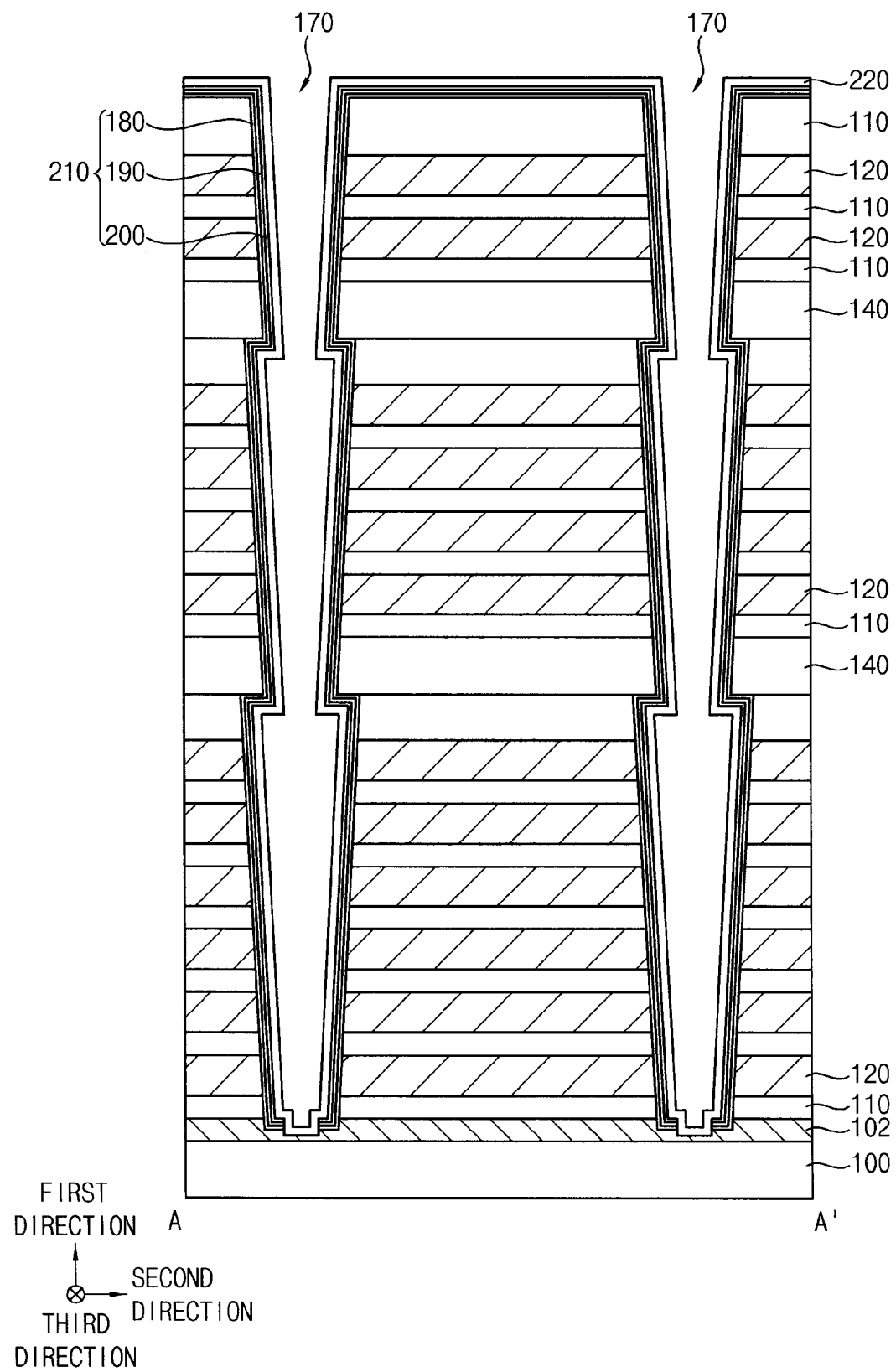

Referring to FIG. 10, a charge storage structure 210 may be formed on a sidewall of the channel hole structure 170 and a portion of the exposed upper surface of the first impurity region 102, and a channel layer 220 may be formed on the charge storage structure 210, a portion of the exposed upper surface of the first impurity region 102, and an uppermost one of the insulation layers 110 of the mold structure.

Particularly, a charge storage structure layer and a second sacrificial layer may be sequentially formed on the sidewall of the channel hole structure 170, the exposed upper surface of the first impurity region 102 and an upper surface of the uppermost one of the insulation layers 110 of the mold structure. A first spacer layer may be formed on the second sacrificial layer, and the first spacer layer may be anisotropically etched to form a first spacer only on the sidewall of the channel hole structure 170. The second sacrificial layer may include, e.g., polysilicon, and the first spacer may include, e.g., silicon oxide or silicon nitride.

The second sacrificial layer and the charge storage structure layer may be etched using the first spacer as an etching mask to form a second sacrificial pattern and the charge storage structure 210, respectively, having a cup-like shape of which a bottom is opened on the sidewall of the channel hole structure 170 and the upper surface of the first impurity region 102. An upper portion of the exposed first impurity region 102 may be also partially removed. In example embodiments, the charge storage structure 210 may include a first blocking pattern 180, a charge storage pattern 190 and a tunnel insulation pattern 200 sequentially stacked.

After removing the first spacer and the second sacrificial pattern, a channel layer 220 may be formed on the first impurity region 102, the charge storage structure 210 and the uppermost one of the insulation layers 110 of the mold structure.

The channel layer 220 may include polysilicon or amorphous silicon. When the channel layer 220 includes amorphous silicon, the channel layer 220 may be converted into crystalline silicon by heat generated during processes of forming other layers. Alternatively, a laser epitaxial growth (LEG) process or a solid phase epitaxy (SPE) process may be further performed so that amorphous silicon may be converted into crystalline silicon.

Figure 11:
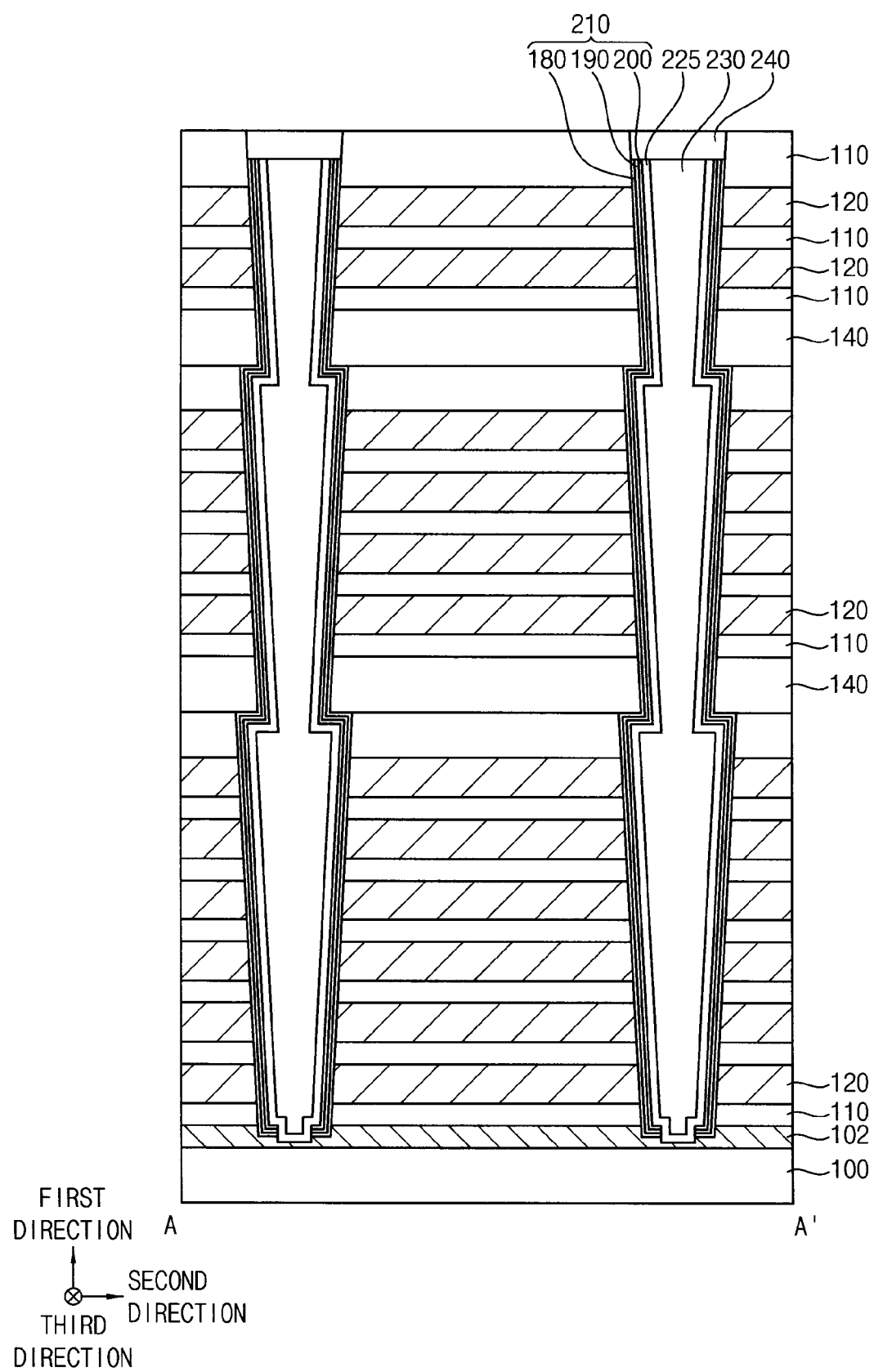

Referring to FIG. 11, a filling layer may be formed on the channel layer 220 to fill a remaining portion of the channel hole structure 170, and the filling layer and the channel layer 220 may be planarized until the upper surface of the uppermost one of the insulation layers 110 of the mold structure is exposed so that a filling pattern 230 filling the remaining portion of the channel hole structure 170 may be formed and the channel layer 220 may be transformed into a channel 225.

Accordingly, the charge storage structure 210, the channel 225 and the filling pattern 230 may be sequentially stacked on the first impurity region 102 in the channel hole structure 170.

Portions of the channel 225 formed in the first to third channel holes 130, 150 and 160 of the channel hole structure 170 may be referred to as first to third portions, respectively, and each of the first to third portions of the channel 225 may have a sidewall that has a constant slope and is oblique to the upper surface of the substrate 100. In example embodiments, each of the first to third portions of the channel 225 may have a width gradually increasing from the bottom to the top.

In example embodiments, a length in the first direction of the first portion of the channel 225 may be shorter than that of each of the second and third portions of the channel 225.

The channel 225 having a cup-like shape of which a bottom is opened, the charge storage structure 210 covering an outer sidewall of the channel 225, and the filling pattern 230 filling an inner space formed by an inner sidewall of the channel 225 may form a first structure having a pillar shape.

An upper portion of the first structure may be removed to form a trench, and a pad 240 may be formed to fill the trench.

In example embodiments, the pad 240 may include doped polysilicon or amorphous silicon, and when the pad 240 includes amorphous silicon, a crystallization process may be further performed thereon.

Referring to FIGS. 12 and 13, a first insulating interlayer 250 may be formed on the uppermost one of the insulation layers 110 and the pad 240, and a first opening 260 may be formed through the first insulating interlayer 250, the insulation layers 110 and the first sacrificial layers 120 of the mold structure, and the first impurity region 102. During the formation of the first opening 260, a portion of the substrate 100 under the first impurity region 102 may be also partially removed.

In example embodiments, the first opening 260 may extend in the third direction, and a plurality of first openings 260 may be formed in the second direction.

As the first opening 260 is formed, the mold structure may be separated along the second direction, the insulation layer 110 may be transformed into insulation patterns 115 each extending in the third direction, the first sacrificial layer 120 may be transformed into first sacrificial patterns each extending in the third direction, and the connecting layer 140 may be transformed into connecting patterns 145 each extending in the third direction.

In example embodiments, on the mold structure formed between the first openings neighboring each other in the second direction, a channel block including a plurality of channels 225 extending through the mold structure in the first direction may be formed, and the channel block may include at least 14 channel columns that include a plurality of channels 225 arranged in the third direction, the channel columns being separated from each other in the second direction. Accordingly, because the plurality of channels 225 may support the mold structure, even when the number of the first sacrificial patterns of the mold structure increases and the aspect ratio of the mold structure is greater, the mold structure may have improved stability and not be tilted toward the first opening 260.

The first sacrificial patterns exposed by the first opening 260 may be removed to form a gap 270 between neighboring ones of the insulation patterns 115 at respective levels. A portion of an outer sidewall of the first blocking pattern 180 may be exposed by the gap 270.

In example embodiments, the first sacrificial patterns exposed by the first opening 260 may be removed by a wet etching process using a solution including phosphoric acid or sulfuric acid.

Referring to FIG. 14, a second blocking layer 280 may be formed on the exposed outer sidewall of the first blocking pattern 180, an inner wall of the gap 270, a surface of the insulation pattern 115, the upper surface of the substrate 100, and an upper surface of the first insulating interlayer 250, and a gate electrode may be formed on the second blocking layer 280 to at least partially fill the gap 270.

The gate electrode may be formed by forming a gate electrode layer on the second blocking layer 280 to sufficiently fill the gap 270 and partially removing the gate electrode layer. In example embodiments, the gate electrode layer may be partially removed by a wet etching process.

In example embodiments, the gate electrode may include a gate conductive pattern and a gate barrier pattern covering lower and upper surfaces and a sidewall of the gate conductive pattern. The gate conductive pattern may include a low resistance metal, e.g., tungsten, titanium, tantalum, etc., and the gate barrier pattern may include a metal nitride, e.g., titanium nitride, tantalum nitride, etc.

The gate electrode may extend in the third direction, and a plurality of gate electrodes may be formed in the second direction.

In example embodiments, the gate electrode may be formed at a plurality of levels spaced apart from each other in the first direction, and the gate electrodes at the plurality of levels may form a gate electrode structure. The gate electrode structure may include at least one first gate electrode 292, a plurality of second gate electrodes 294, and at least one third gate electrode 296 sequentially stacked.

In example embodiments, the channel 225 may extend in the first direction through the plurality of gate electrodes. Particularly, the first portion of the channel 225 may extend through the first gate electrode 292, the second portion of the channel 225 may extend through some of the second gate electrodes 294, and the third portion of the channel 225 may extend through some of the second gate electrodes 294 and the third gate electrode 296.

Referring to FIG. 15, impurities may be implanted into an upper portion of the substrate 100 through a portion of the second blocking layer 280 on a bottom of the first opening 260 to form a second impurity region 104. In example embodiments, the impurities may include n-type impurities, e.g., phosphorus, arsenic, etc.

A second spacer layer may be formed on the second blocking layer 280, and may be anisotropically etched to form a second spacer 300 on a sidewall of the first opening 260, and thus a portion of the second blocking layer 280 on the second impurity region 104 may be exposed.

A portion of the second blocking layer 280 not covered by the second spacer 300 may be etched, and a portion of the second blocking layer 280 on the upper surface of the first insulating interlayer 250 may be also removed. During the etching process, a portion of the second impurity region 104 at the upper portion of the substrate 100 may be also partially removed.

A conductive layer may be formed on an upper surface of the second impurity region 104, the second spacer 300 and the first insulating interlayer 250 to fill a remaining portion of the first opening 260, and may be planarized until the upper surface of the first insulating interlayer 250 may be exposed to form a common source line (CSL) 310.

As the CSL 310 is formed, the second blocking layer 280 may be transformed into a second blocking pattern 285.

In example embodiments, the CSL 310 may extend in the first direction, and also in the third direction. A lower surface of the CSL 310 may be covered by the second impurity region 104. In example embodiments, a plurality of CSLs 310 may be formed along the second direction to be spaced apart from each other.

Figure 17A:
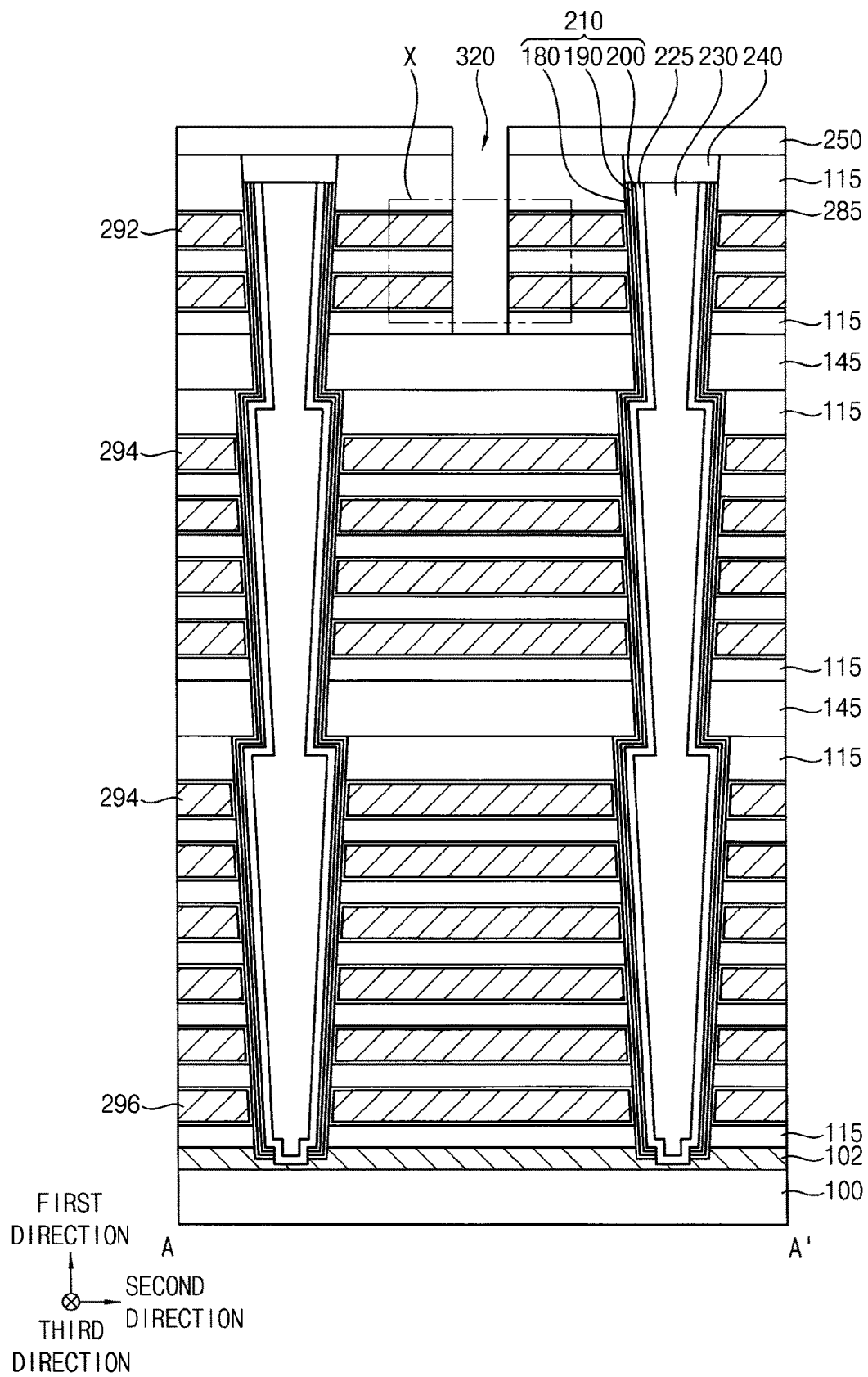
Figure 17B:
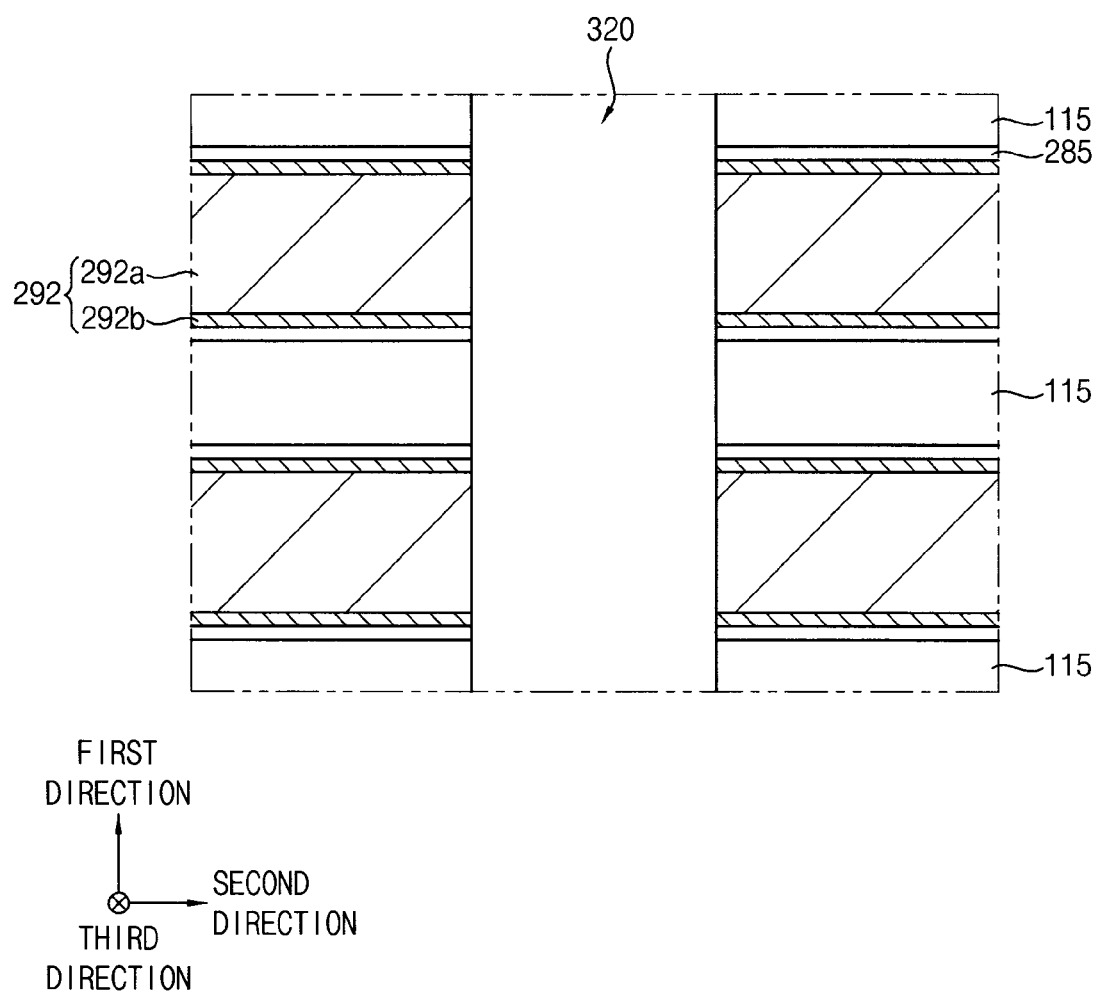

Referring to FIGS. 16, 17A and 17B, a fourth photoresist pattern may be formed on the first insulating interlayer 250, and the first insulating interlayer 250, the second blocking pattern 285, the first gate electrodes 292 and the insulation patterns 115 formed on and under the first gate electrode 292 may be etched using the fourth photoresist pattern as an etching mask to form a second opening 320 exposing an upper surface of the uppermost connecting pattern 145.

Accordingly, a sidewall of the first gate conductive pattern 292a of each of the first gate electrodes 292, a sidewall of the first gate barrier pattern 292b covering lower and upper surfaces and a portion of a sidewall of the first gate barrier pattern 292b and a sidewall of the second blocking pattern 285 covering lower and upper surfaces and a portion of a sidewall of the first gate barrier pattern 292b may be exposed by the second opening 320, and the first gate electrode 292 may be separated in the second direction by the second opening 320.

In example embodiments, the second opening 320 may extend in the third direction, and a plurality of second openings 320 may be formed along the second direction. In example embodiments, more than two second openings 320 may be formed between two CSLs 310 neighboring each other in the second direction.

In example embodiments, the second opening 320 may have a sidewall substantially vertical to the upper surface of the substrate 100, however, embodiments are not limited thereto.

The second opening 320 may partially extend through the pad 240 and an upper portion of the first structure. The channel 225 formed under the second opening 320 and included in the first structure of which the upper portion is partially extended may be a dummy channel.

Referring to FIGS. 1, 2A, 2B and 3 again, a second insulating interlayer 330 may be formed on the first insulating interlayer 250, the CSL 310, the second spacer 300 and the second blocking pattern.

The second insulating interlayer 330 may be formed to fill the second opening 320, and thus a lower surface of the second insulating interlayer 330 may have a protrusion 335 protruding in the first direction.

The protrusion 335 of the second insulating interlayer may directly contact the sidewall of the first gate conductive pattern 292a of each of the first gate electrodes 292, the sidewall of the first gate barrier pattern 292b covering lower and upper surfaces and the portion of a sidewall of the first gate barrier pattern 292b, and the sidewall of the second blocking pattern 285 covering lower and upper surfaces and the portion of a sidewall of the first gate barrier pattern 292b exposed by the second opening 320.

Hereinafter, the protrusion 335 of the second insulating interlayer is referred to as an insulating isolation pattern 335.

In example embodiments, the insulating isolation pattern 335 may extend through at least an uppermost first gate electrode 292 among the gate electrodes in the first direction, and may separate the uppermost first gate electrode 292 in the second direction.

In example embodiments, the insulating isolation pattern 335 may extend in the third direction, and a plurality of insulating isolation patterns 335 may be formed to be spaced apart from each other between two CSLs 310 neighboring each other in the second direction.

In example embodiments, the channel block including more than 14 channel columns may be formed between the two CSLs 310 neighboring each other in the second direction. However, channels 225 included in two channel columns under the insulating isolation pattern 335 among the channel columns may serve as dummy channels, so that only channels 225 included in twelve channel columns may serve as channels.

A contact plug 340 may be formed through the first and second insulating interlayers 250 and 330 to contact an upper surface of the pad 240, a third insulating interlayer 350 may be formed on the second insulating interlayer 330 and the contact plug 340, and a bit line 360 may be formed through the third insulating interlayer 350 to contact an upper surface of the contact plug 340.

In example embodiments, the bit line 360 may extend in the second direction, and a plurality of bit lines 360 may be formed in the third direction.

The vertical memory device may be manufactured by the above processes.

As illustrated above, the channel block including 14 or more channel columns arranged in the second direction may be formed on the mold structure between the first openings 260 neighboring each other in the second direction, and thus the mold structure may have improved stability and not be tilted even when the aspect ratio of the mold structure is great.

As the channel block includes the plurality of channel columns, two or more insulating isolation patterns 335 may be formed to separate the first gate electrode 292 serving as a SSL, however, the second opening 320 for forming of the insulating isolation pattern 335 may be formed after the gate electrode is formed. Accordingly, in the case that the plurality of second openings 320 are formed before the gate electrode is formed, when the gate electrode is formed through the gap 270, a void occurring by that the gap 270 is partially blocked by the second openings 320 may not occur.

Figure 18A:
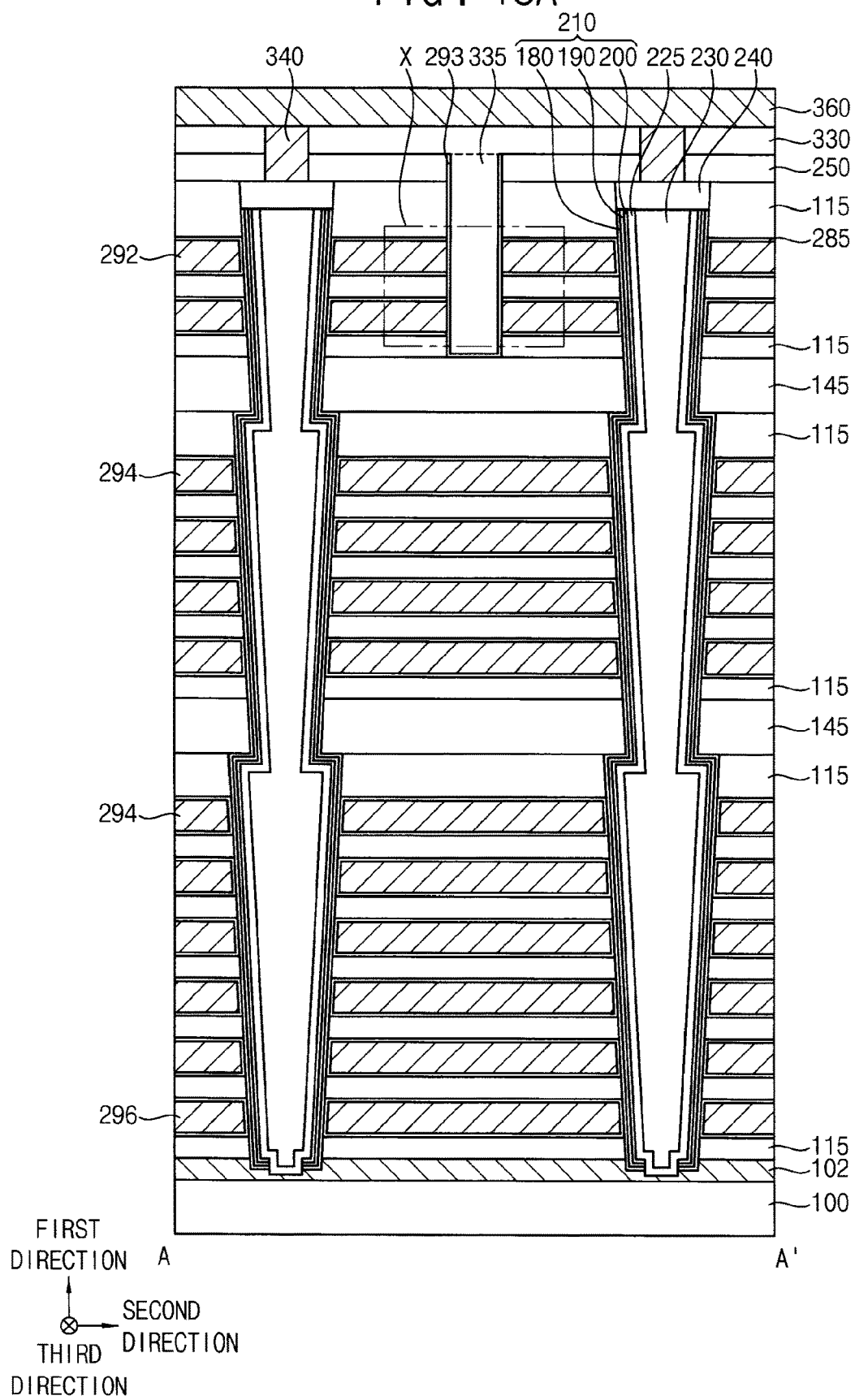
FIGS. 18A and 18B are cross-sectional views illustrating a vertical memory device in accordance with example embodiments.
Figure 18B:
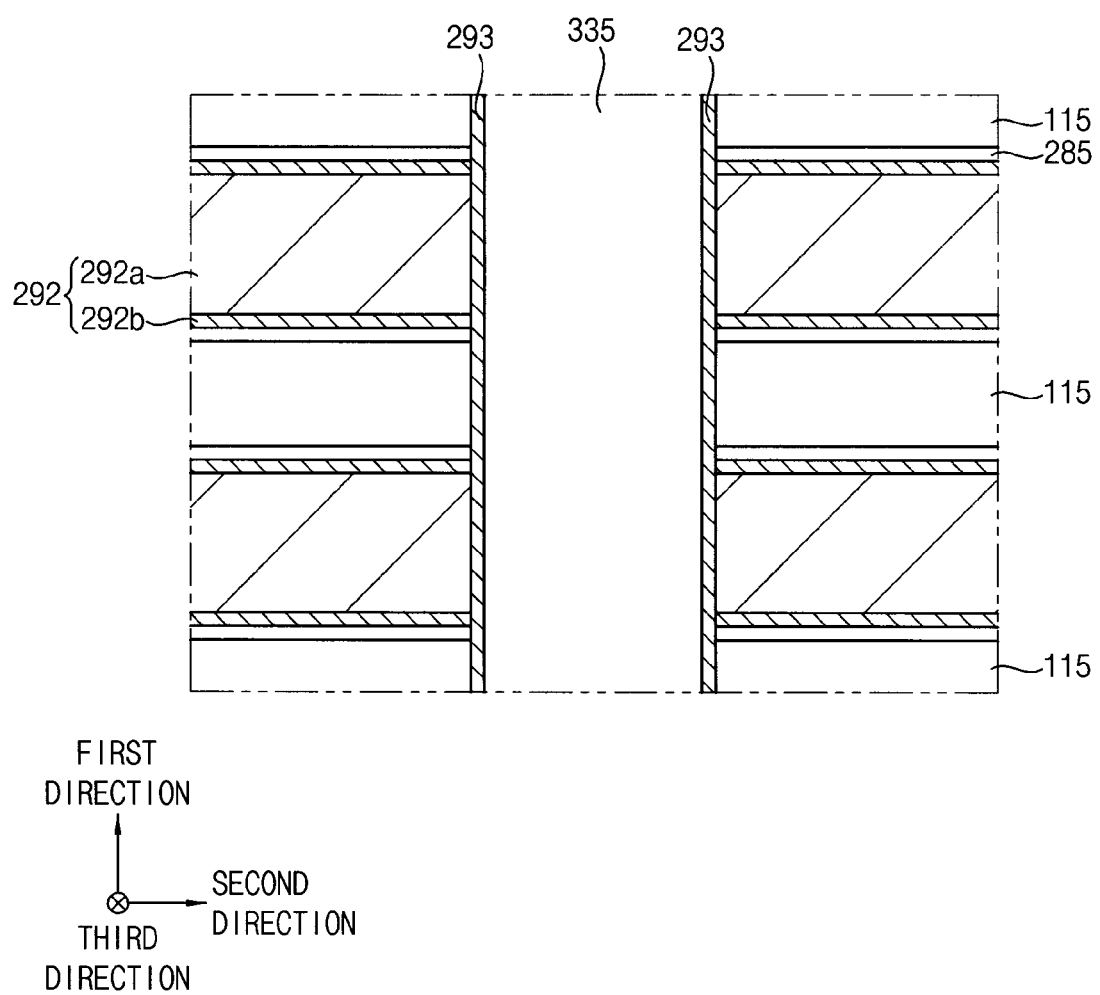

FIGS. 18A and 18B are cross-sectional views illustrating a vertical memory device in accordance with example embodiments. FIG. 18A is a cross-sectional view taken along the line A-A' of FIG. 1, and FIG. 18B is an enlarged cross-sectional view of a region X of FIG. 18A.

The vertical memory device may be substantially the same as or similar to that of FIGS. 2A and 2B, except for the shape of the gate barrier pattern. Thus, like reference numerals refer to like elements, and detailed descriptions thereon are omitted herein.

Referring to FIGS. 18A and 18B, in the processes described in FIGS. 16, 17A and 18B, after forming the second opening 320, a second gate barrier pattern 293 may be formed to cover a sidewall and a bottom of the second opening 320.

Particularly, the second gate barrier pattern 293 may be formed by conformally forming a second gate barrier layer on the sidewall and the bottom of the second opening 320, and an upper surface of the second insulating interlayer 330, and planarizing the second gate barrier layer until the upper surface of the second insulating interlayer 330 is exposed.

Accordingly, the second gate barrier pattern 293 may directly contact a sidewall of the first gate electrode 292 opposite to the insulating isolation pattern 335, that is, each of sidewalls of the first gate conductive pattern 292a and the first gate barrier pattern 292b opposite to the insulating isolation pattern 335. The second gate barrier pattern 293 may also directly contact portions of the second blocking pattern 285 on the upper and lower surfaces of the first gate electrode 292.

In example embodiments, the second gate barrier pattern 293 may include substantially the same material as the first gate barrier pattern 292b of the first gate electrode 292, e.g., a metal nitride such as titanium nitride, tantalum nitride, etc., and in this case, the second gate barrier pattern 293 contacting the first gate electrode 292 may be considered to be included in the first gate electrode 292 by being merged with the first gate barrier pattern 292b.

Alternatively, the second gate barrier pattern 293 may include a metal nitride, but different material from the first gate barrier pattern 292b of the first gate electrode 292, and in this case, the second gate barrier pattern 293 may not be merged with the first gate barrier pattern 292b.

Figure 19A:
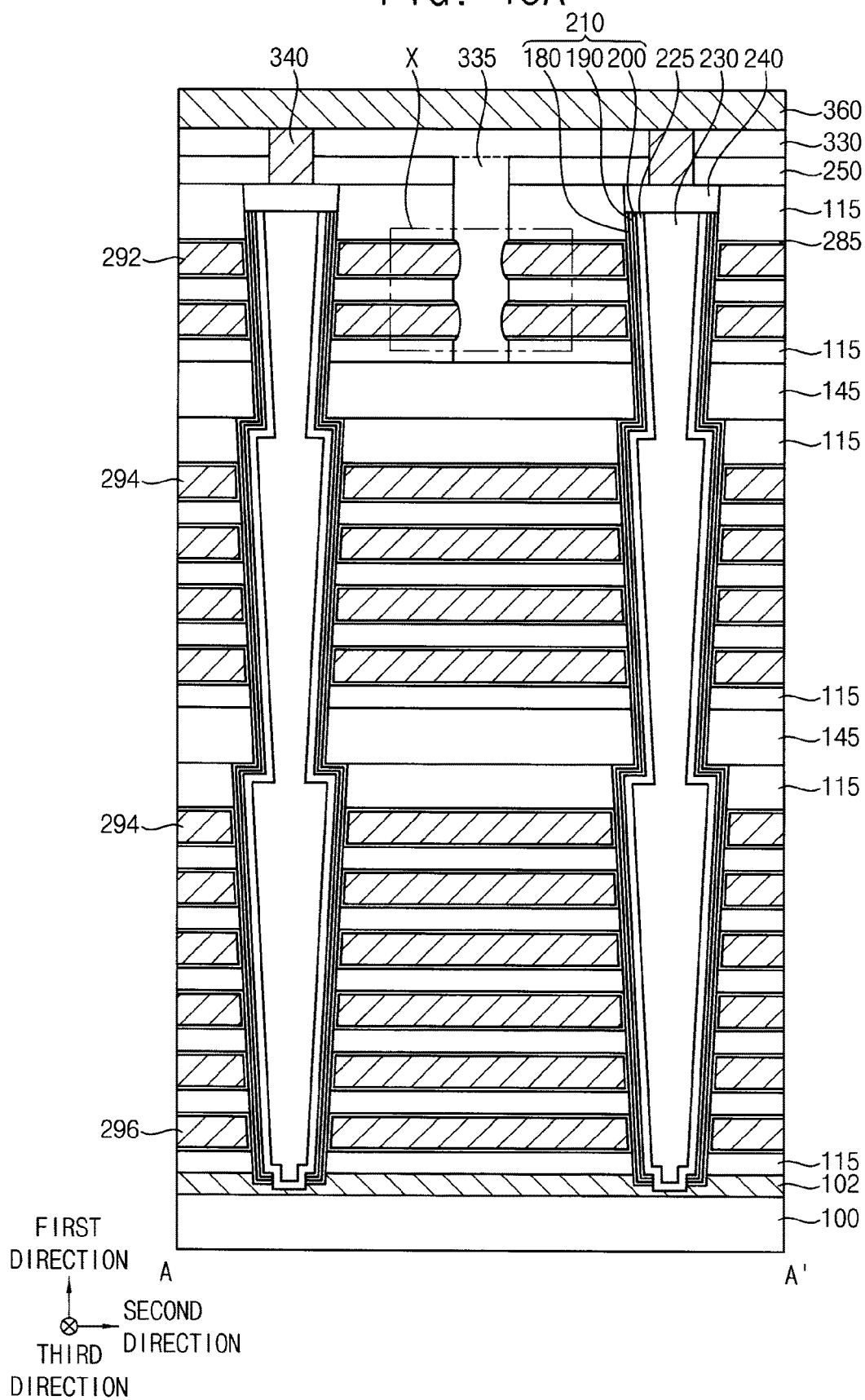
FIGS. 19A and 19B are cross-sectional views illustrating a vertical memory device in accordance with example embodiments.
Figure 19B:
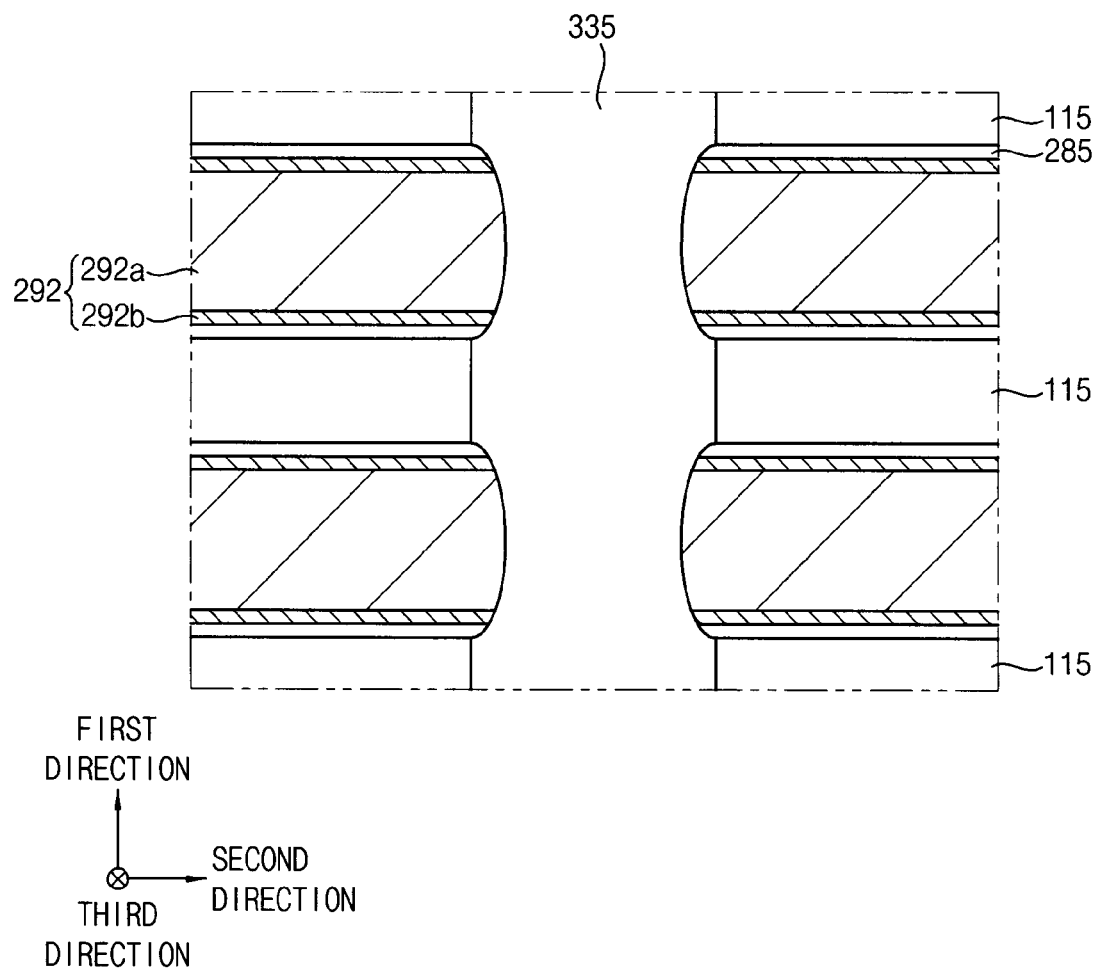

FIGS. 19A and 19B are cross-sectional views illustrating a vertical memory device in accordance with example embodiments. FIG. 19A is a cross-sectional view taken along the line A-A' of FIG. 1, and FIG. 19B is an enlarged cross-sectional view of a region X of FIG. 19A.

The vertical memory device may be substantially the same as or similar to that of FIGS. 2A and 2B, except for the shape of the gate barrier pattern. Thus, like reference numerals refer to like elements, and detailed descriptions thereon are omitted herein.

Referring to FIGS. 19A and 19B, a sidewall of the insulating isolation pattern 335 may have a shape in which portions contacting the first gate electrodes 292 are concave, and thus may have a concavo-convex shape as a whole.

Particularly, during an etching process for formation of the second opening 320, the gate electrodes 292 may be less etched than the insulation patterns 115 according to the characteristic of the etching process, and thus the insulating isolation pattern 335 may be formed to have the sidewall of the concavo-convex shape.

Figure 20:
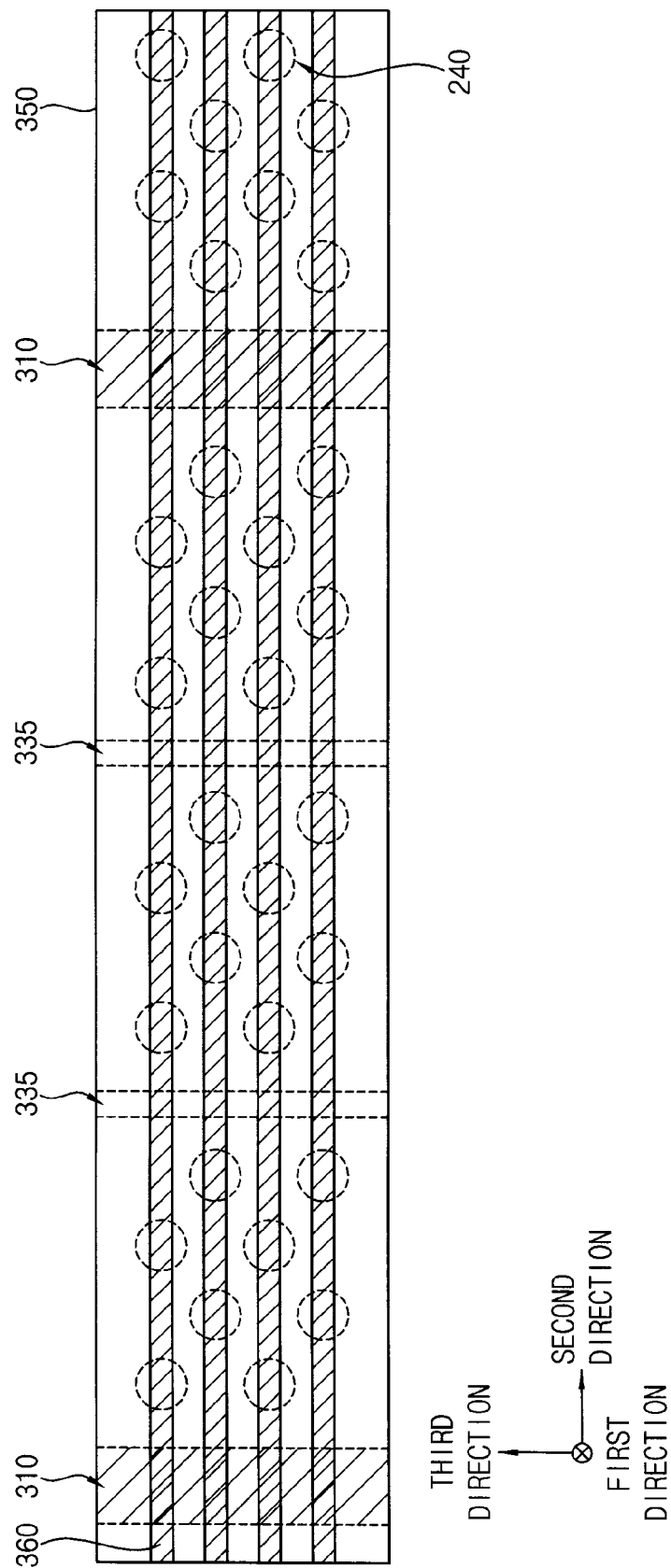
Figure 21:
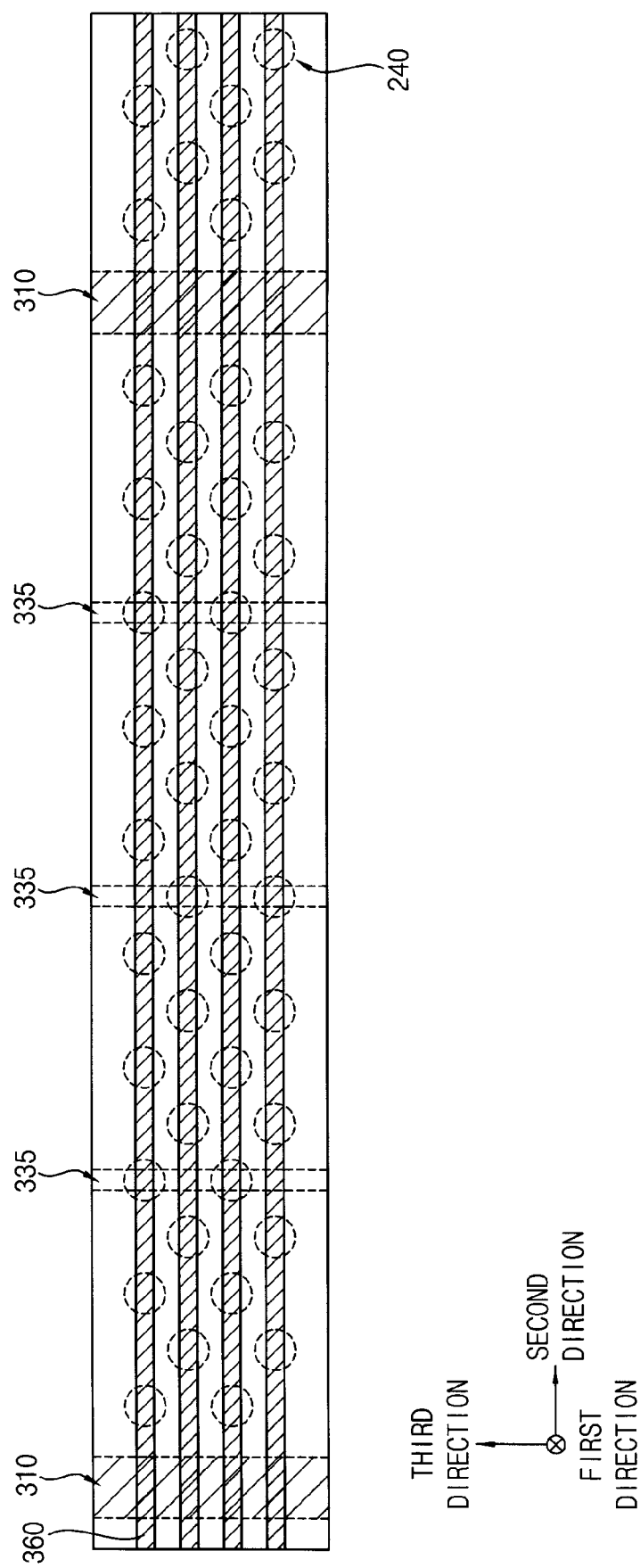

FIGS. 20 to 22 are plan views illustrating vertical memory devices in accordance with example embodiments.

Those vertical memory devices may be substantially the same as or similar to that of FIG. 1, except for the number of channel columns included in the channel block and the arrangement of the insulating isolation pattern. Thus, like reference numerals refer to like elements, and detailed descriptions thereon are omitted herein.

Referring to FIG. 20, the channel block may include 12 channel columns arranged in the second direction, and the insulating isolation pattern 335 may be formed between the channels 225 instead of extending through the upper portions of the channels 225. Accordingly, all of the channels 225 included in respective channel columns may serve as channels, and no dummy channel may be formed. In one embodiment, 2 insulating isolation patterns 335 may be formed on one channel block, and 4 channel columns may be disposed between two neighboring insulating isolation patterns 335. Also, 4 channel columns may be disposed between the insulating isolation pattern 335 and the CSL 310 adjacent thereto.

Referring to FIG. 21, the channel block may include 19 channel columns arranged in the second direction, and the insulating isolation pattern 335 may be formed extending through an upper portion of each of the channels 225 included in 3 channel columns among the 19 channel columns. Accordingly, the channels 225 of the 3 channel columns may be dummy channels, and 4 channel columns serving as channels may be disposed between two neighboring insulating isolation patterns 335. Also, 4 channel columns may be disposed between the insulating isolation pattern 335 and the CSL 310 adjacent thereto.

Referring to FIG. 22, the channel block may include 24 channel columns arranged in the second direction, and the insulating isolation pattern 335 may be formed extending through an upper portion of each of the channels 225 included in 4 channel columns among the 24 channel columns. Accordingly, the channels 225 of the 4 channel columns may be dummy channels, and 4 channel columns serving as channels may be disposed between two neighboring insulating isolation patterns 335. Also, 4 channel columns may be disposed between the insulating isolation pattern 335 and the CSL 310 adjacent thereto.

Although embodiments have been described above, those skilled in the art will readily appreciate that many modifications are possible without materially departing from the present disclosure.

What is claimed is:

1. A vertical memory device, comprising:
   gate electrodes formed on a substrate and spaced apart from each other in a first direction substantially perpendicular to an upper surface of the substrate, the gate electrodes comprising a first gate electrode and a second gate electrode that is interposed between the first gate electrode and the substrate;
   a channel extending through the gate electrodes in the first direction, the channel comprising a plurality of portions, each of which has a width that gradually increases as distance from the substrate increases, the plurality of portions being sequentially stacked and connected with each other;
   a charge storage structure disposed on an outer sidewall of the channel, the charge storage structure comprising a tunnel insulation pattern, a charge storage pattern and a first blocking pattern sequentially stacked, the charge storage structure having a horizontal segment in which each of the tunnel insulation pattern, the charge storage pattern and the first blocking pattern extend substantially in parallel with the upper surface of the substrate at an interface between two of the plurality of portions;
   an insulating isolation pattern extending through the first gate electrode in the first direction, wherein portions of the first gate electrode are spaced apart from each other by the insulating isolation pattern in a second direction substantially parallel to the upper surface of the substrate; and
   a blocking pattern disposed on an upper surface, a lower surface and a sidewall of each of the gate electrodes, the sidewall of the gate electrodes facing the channel,
   wherein the insulating isolation pattern directly contacts the first gate electrode.

2. The vertical memory device of claim 1, wherein the blocking pattern comprises a metal oxide.

3. The vertical memory device of claim 1, wherein each of the gate electrodes comprises:
   a gate conductive pattern comprising a metal; and
   a first gate barrier pattern covering an upper surface, a lower surface and a sidewall of the gate conductive pattern, the sidewall of the gate conductive pattern facing the channel, and the first gate barrier pattern comprising a metal nitride, and
   wherein the insulating isolation pattern directly contacts each of the gate conductive pattern and the first gate barrier pattern of the first gate electrode.

4. The vertical memory device of claim 1, wherein each of the gate electrodes comprises:
   a gate conductive pattern comprising a metal; and
   a first gate barrier pattern covering an upper surface, a lower surface and a first sidewall of the gate conductive pattern, the first sidewall of the gate conductive pattern facing the channel, and the first gate barrier pattern comprising a metal nitride,
   wherein the first gate electrode further comprises a second gate barrier pattern covering a second sidewall of the gate conductive pattern, the second sidewall of the gate conductive pattern facing the insulating isolation pattern, and the second gate barrier pattern comprising a metal nitride, and
   wherein the insulating isolation pattern directly contacts the second gate barrier pattern.

5. The vertical memory device of claim 4, wherein the second gate barrier pattern directly contacts the second gate barrier pattern and portions of the blocking pattern formed on the upper surface and the lower surface of the first gate electrode.

6. The vertical memory device of claim 4, wherein the second gate barrier pattern comprises a material different from the first gate barrier pattern.

7. The vertical memory device of claim 1, wherein the second gate electrode is one from among a plurality of second gate electrodes interposed between the first gate electrode and the substrate,
   wherein the gate electrodes further comprise a third gate electrode interposed between the substrate and the plurality of second gate electrodes,
   wherein the first gate electrode serves as a string selection line (SSL),
   wherein each of the plurality of second gate electrodes serves as a word line, and wherein the third gate electrode serves as a ground selection line (GSL).

8. The vertical memory device of claim 7, wherein the first gate electrode comprises two first gate electrodes formed on an uppermost level and at least one level thereunder among the gate electrodes, and
wherein the third gate electrode is formed on a lowermost level of the gate electrodes.

9. The vertical memory device of claim 1, wherein a first portion from among the plurality of portions extends through the first gate electrode.

10. The vertical memory device of claim 9, wherein the first portion of the channel has a length in the first direction less than that of each remaining portion of the plurality of portions of the channel.

11. The vertical memory device of claim 1, further comprising a plurality of common source lines (CSLs) extending through each of the gate electrodes in the first direction and separating the gate electrodes in the second direction, the plurality of CSLs formed to be spaced apart from each other along the second direction.

12. The vertical memory device of claim 11, wherein the plurality of CSLs comprises a first CSL and a second CSL spaced apart from each other in the second direction,
wherein the channel is one from among a plurality of channels interposed between the first CSL and the second CSL to form a channel block, the plurality of channels being spaced apart from each other along each of the second direction and a third direction substantially parallel to the upper surface of the substrate and intersecting the second direction, and
wherein the plurality of channels of the channel block comprises at least 12 channels.

13. The vertical memory device of claim 12, wherein the insulating isolation pattern is one from among a plurality of insulating isolation patterns formed to be spaced apart from each other along the second direction between the first CSL and the second CSL.

14. The vertical memory device of claim 12, wherein the plurality of channels comprises a dummy channel, and
wherein the insulating isolation pattern extends through an upper portion of the dummy channel.

15. The vertical memory device of claim 12, wherein the insulating isolation pattern is offset from each of the plurality of channels in the second direction and the third direction.

16. A vertical memory device, comprising:
a channel extending on a substrate in a vertical direction substantially perpendicular to an upper surface of the substrate, the channel comprises a plurality of portions, each of the plurality of portions of the channel having a width that gradually increases as distance from the substrate increases, the plurality of portions being sequentially stacked and connected with each other;
a charge storage structure disposed on an outer sidewall of the channel, the charge storage structure comprising a tunnel insulation pattern, a charge storage pattern and a first blocking pattern sequentially stacked, the charge storage structure having a horizontal segment in which each of the tunnel insulation pattern, the charge storage pattern and the first blocking pattern extend substantially in parallel with the upper surface of the substrate at an interface between two of the plurality of portions;
gate electrodes spaced apart from each other on the substrate in the vertical direction, each of the gate electrodes surrounding the channel, in a horizontal direction substantially parallel to the upper surface of the substrate, and comprising a gate conductive pattern and a gate barrier pattern that covers an upper surface, a lower surface and a sidewall of the gate conductive pattern, the sidewall of the gate conductive pattern facing the channel; and
an insulating isolation pattern extending through a first gate electrode and at least one gate electrode that is interposed between the substrate and the first gate electrode, and the insulating isolation pattern separating the first gate electrode in the horizontal direction,
wherein the first gate electrode surrounds a first portion of the plurality of portions of the channel, remaining portions of the plurality of portions of the channel being interposed between the substrate and the first portion, and
wherein the first portion of the channel has a length in the vertical direction shorter than that of each of the remaining portions of the plurality of portions of the channel.

17. The vertical memory device of claim 16, wherein the insulating isolation pattern directly contacts each of the gate conductive pattern and the gate barrier pattern of the first gate electrode.

18. The vertical memory device of claim 16, wherein the gate barrier pattern is a first gate barrier pattern,
wherein the vertical memory device further comprises a second gate barrier pattern covering a sidewall and a lower surface of the insulating isolation pattern, and
wherein the second gate barrier pattern directly contacts each of the gate conductive pattern and the first gate barrier pattern of the first gate electrode.

19. The vertical memory device of claim 16, wherein a sidewall of the insulating isolation pattern has a concavo-convex shape.

20. A vertical memory device, comprising:
gate electrodes disposed on a substrate and separated from each other in a first direction substantially perpendicular to an upper surface of the substrate;
a plurality of common source lines (CSLs) spaced apart from each other along a second direction substantially parallel to the upper surface of the substrate, each of the plurality of CSLs extending through each of the gate electrodes in the first direction and extending in a third direction substantially parallel to the upper surface of the substrate and intersecting the second direction;
channels spaced apart from each other along each of the second direction and the third direction between two adjacent CSLs from among the plurality of CSLs, each of the channels extending through the gate electrodes in the first direction and comprising a plurality of portions, each of which has a width that gradually increases as distance from the substrate increases, the plurality of portions respectively corresponding to each of the channels being sequentially stacked and connected with each other;
a charge storage structure disposed on an outer sidewall of each of the channels, the charge storage structure comprising a tunnel insulation pattern, a charge storage pattern and a first blocking pattern sequentially stacked, the charge storage structure having a horizontal segment in which each of the tunnel insulation pattern, the charge storage pattern and the first blocking pattern extend substantially in parallel with the upper surface of the substrate at an interface between two of the plurality of portions;
pads formed on each of the channels;

an insulating isolation pattern extending in the first direction through and directly in contact with a first gate electrode, from among the gate electrodes, that acts as a string selection line (SSL) and is formed on an uppermost level among the gate electrodes, and extending in the third direction to separate the first gate electrode in the second direction;

a second blocking pattern covering an upper surface, a lower surface, and a sidewall of each of the gate electrodes, the sidewall of the gate electrodes facing one of the channels; and a plurality of bit lines spaced apart from each other and electrically connected with the pads, each of the plurality of bit lines extending in the second direction.

* * * * *